(12) United States Patent
Johnson et al.

(10) Patent No.: US 7,581,549 B2
(45) Date of Patent: Sep. 1, 2009

(54) METHOD FOR REMOVING CARBON-CONTAINING RESIDUES FROM A SUBSTRATE

(75) Inventors: Andrew David Johnson, Doylestown, PA (US); Hoshang Subawalla, Spring, TX (US); Bing Ji, Allentown, PA (US); Raymond Nicholas Vrtis, Orefield, PA (US); Eugene Joseph Karwacki, Jr., Orefield, PA (US); Robert Gordon Ridgeway, Quakertown, PA (US); Peter James Maroulis, Alburtis, PA (US); Mark Leonard O'Neill, Allentown, PA (US); Aaron Scott Lukas, Washington, DC (US); Stephen Andrew Motika, Kutztown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 564 days.

(21) Appl. No.: 11/178,545

(22) Filed: Jul. 12, 2005

(65) Prior Publication Data
US 2006/0027249 A1    Feb. 9, 2006

Related U.S. Application Data

(60) Provisional application No. 60/590,628, filed on Jul. 23, 2004.

(51) Int. Cl.
   C25F 1/00    (2006.01)
   C25F 3/30    (2006.01)
   C25F 5/00    (2006.01)
(52) U.S. Cl. .................................. 134/1.2; 427/248.1
(58) Field of Classification Search .................. 134/1.1, 134/1.2, 1.3; 216/74; 427/248.1
   See application file for complete search history.

(56) References Cited

U.S. PATENT DOCUMENTS

| 5,679,215 A | 10/1997 | Barnes et al. |
| 5,788,778 A | 8/1998 | Shang et al. |
| 5,843,239 A | 12/1998 | Shrotriya |
| 6,130,166 A | 10/2000 | Yeh |
| 6,171,945 B1 | 1/2001 | Mandal et al. |

(Continued)

FOREIGN PATENT DOCUMENTS

EP    1 143 498 A2    10/2001

(Continued)

OTHER PUBLICATIONS

European Search Report No. 05015747.8-2122, dated May 17, 2006.

*Primary Examiner*—Roberts Culbert
(74) *Attorney, Agent, or Firm*—Rosaleen P. Morris-Oskanian

(57) ABSTRACT

A process for removing carbon-containing residues from a substrate is described herein. In one aspect, there is provided a process for removing carbon-containing residue from at least a portion of a surface of a substrate comprising: providing a process gas comprising an oxygen source, a fluorine source, an and optionally additive gas wherein the molar ratio of oxygen to fluorine contained within the process gas ranges from about 1 to about 10; activating the process gas using at least one energy source to provide reactive species; and contacting the surface of the substrate with the reactive species to volatilize and remove the carbon-containing residue from the surface.

20 Claims, 21 Drawing Sheets

QMS Effluent Profiles for $NF_3/O_2/Ar$ Remote Clean with $O_2/NF_3$ Ratio = 4 and Pressure = 2.5 torr FTIR Effluent Profiles for $NF_3/O_2/Ar$ Remote Clean with $O_2/NF_3$ Ratio = 4 and Pressure = 2.5 torr

U.S. PATENT DOCUMENTS

| | | |
|---|---|---|
| 6,204,202 B1 | 3/2001 | Leung et al. |
| 6,255,222 B1 | 7/2001 | Xia et al. |
| 6,569,257 B1 | 5/2003 | Nguyen et al. |
| 6,583,048 B1 | 6/2003 | Vincent et al. |
| 6,673,262 B1 * | 1/2004 | Mori et al. ................. 252/79.3 |
| 6,716,770 B2 | 4/2004 | O'Neill et al. |
| 6,846,525 B2 | 1/2005 | Malhotra |
| 2002/0000546 A1 * | 1/2002 | Sato ............................. 257/1 |
| 2003/0000546 A1 | 1/2003 | Richardson et al. |
| 2003/0005943 A1 | 1/2003 | Singh et al. |
| 2003/0010355 A1 | 1/2003 | Nowak et al. |
| 2003/0143846 A1 | 7/2003 | Sekiya et al. |
| 2003/0183244 A1 | 10/2003 | Rossman |
| 2003/0198742 A1 * | 10/2003 | Vrtis et al. ............. 427/255.28 |
| 2004/0025903 A1 | 2/2004 | Howard |
| 2004/0043626 A1 * | 3/2004 | Chou San et al. ........... 438/758 |
| 2004/0074516 A1 | 4/2004 | Hogle et al. |
| 2004/0096593 A1 | 5/2004 | Lukas et al. |
| 2004/0096672 A1 | 5/2004 | Lukas et al. |
| 2004/0097091 A1 | 5/2004 | Mouri et al. |
| 2004/0129671 A1 | 7/2004 | Ji et al. |
| 2004/0175501 A1 | 9/2004 | Lukas et al. |
| 2004/0175957 A1 | 9/2004 | Lukas et al. |
| 2004/0197474 A1 | 10/2004 | Vrtis et al. |
| 2004/0241463 A1 | 12/2004 | Vincent et al. |
| 2005/0098105 A1 | 5/2005 | Fuss et al. |

FOREIGN PATENT DOCUMENTS

| | | |
|---|---|---|
| EP | 1 318 542 A1 | 6/2003 |
| JP | 2000-063826 A | 2/2000 |
| JP | 2002-280376 A | 9/2002 |
| JP | 2003-100870 A | 4/2003 |
| JP | 2004-006822 A | 1/2004 |
| JP | 2004-039740 A | 2/2004 |
| JP | 2004-134766 A | 4/2004 |
| JP | 2007-531288 A | 11/2007 |
| TW | 546707 | 8/2003 |
| WO | WO 97/13646 | 4/1997 |
| WO | WO 02/07194 A2 | 1/2002 |
| WO | 02/090615 A1 | 11/2002 |
| WO | WO 02/090615 A1 | 11/2002 |
| WO | WO 03/054247 A2 | 7/2003 |
| WO | WO 2005/098086 A2 | 10/2005 |

* cited by examiner

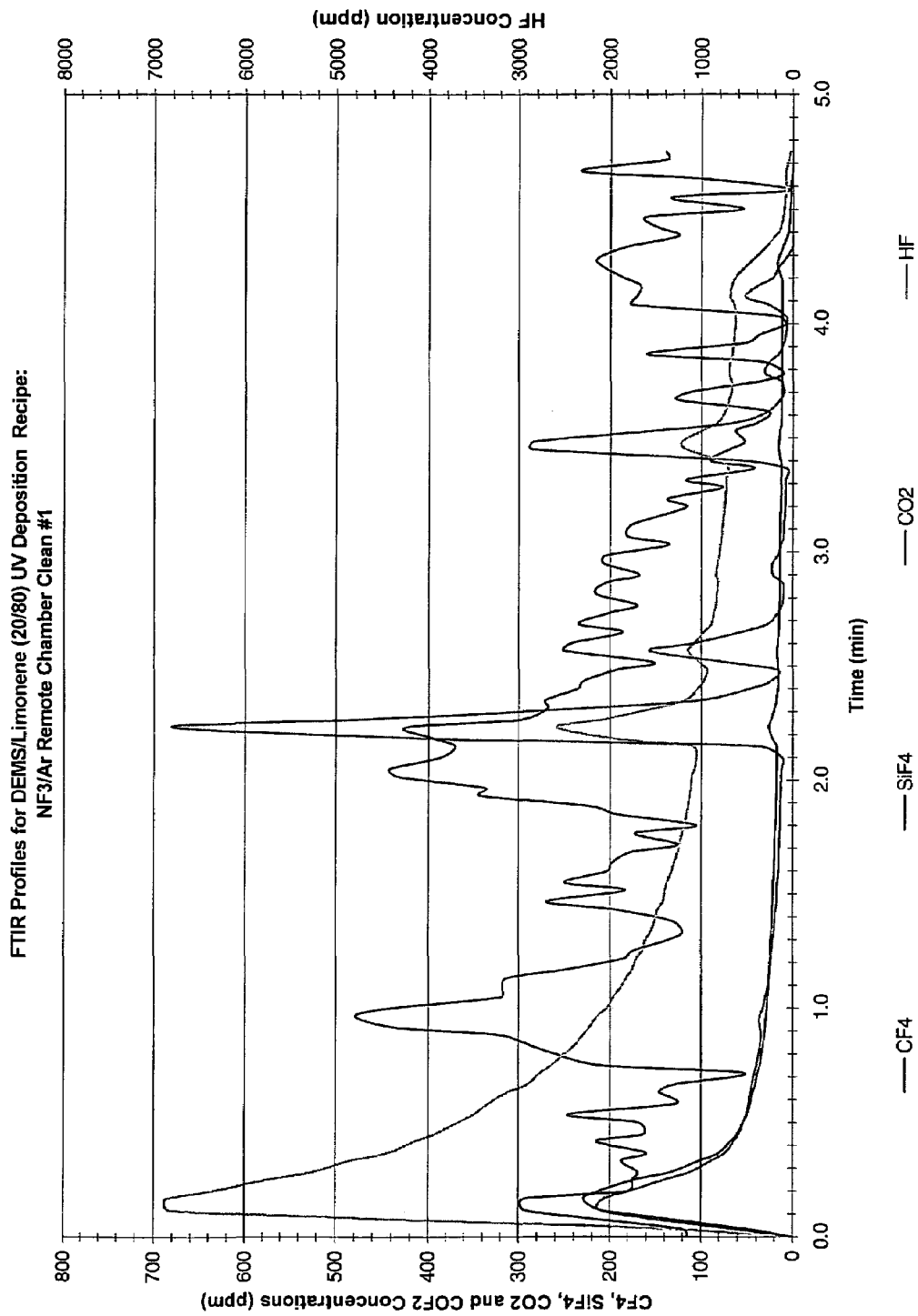
Figure 1. FTIR Effluent Profiles for $NF_3/Ar$ Remote Clean

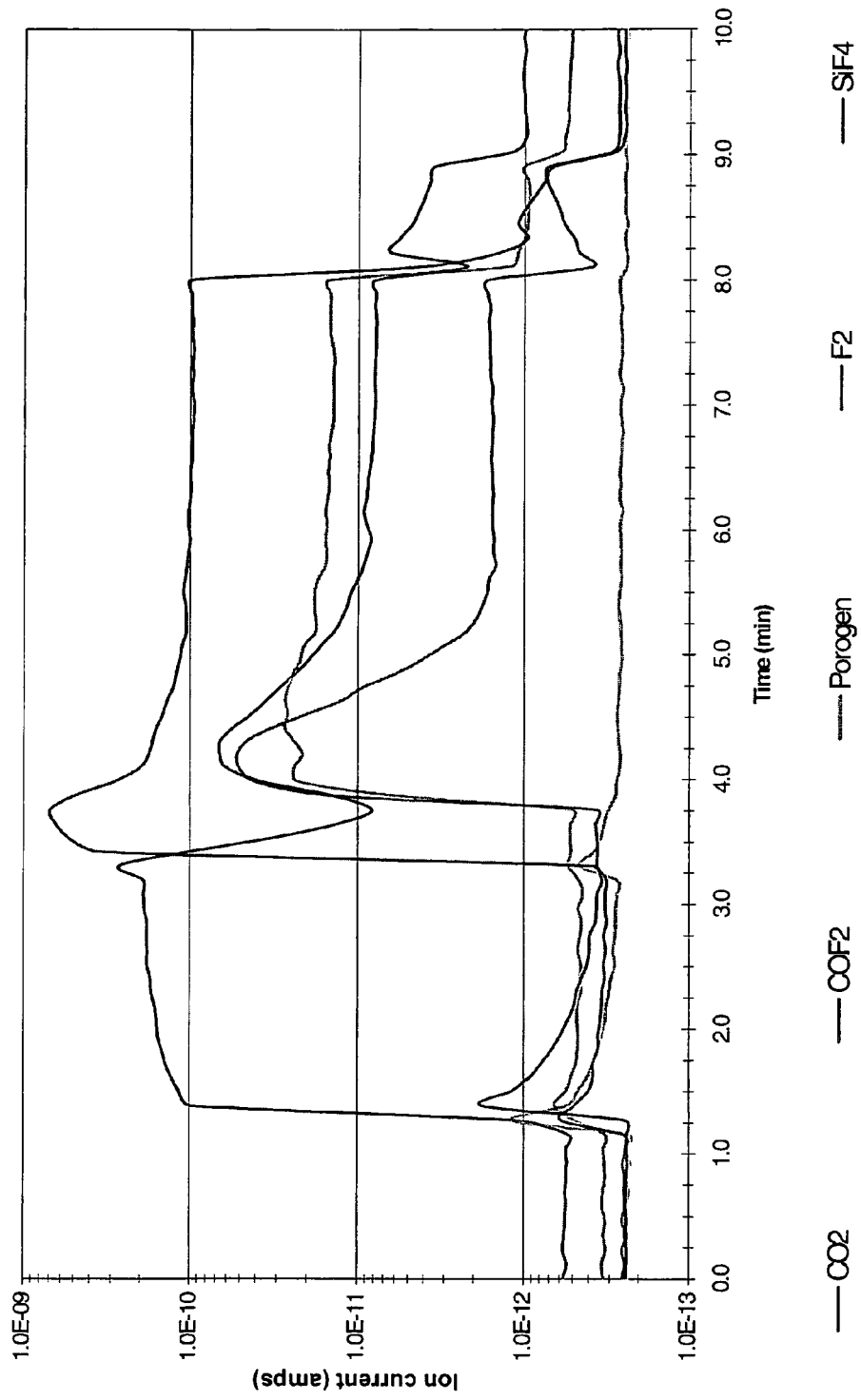
Figure 2a. QMS Effluent Profiles for $NF_3/O_2/Ar$ Remote Clean with $O_2/NF_3$ Ratio = 4 and Pressure = 2.5 torr

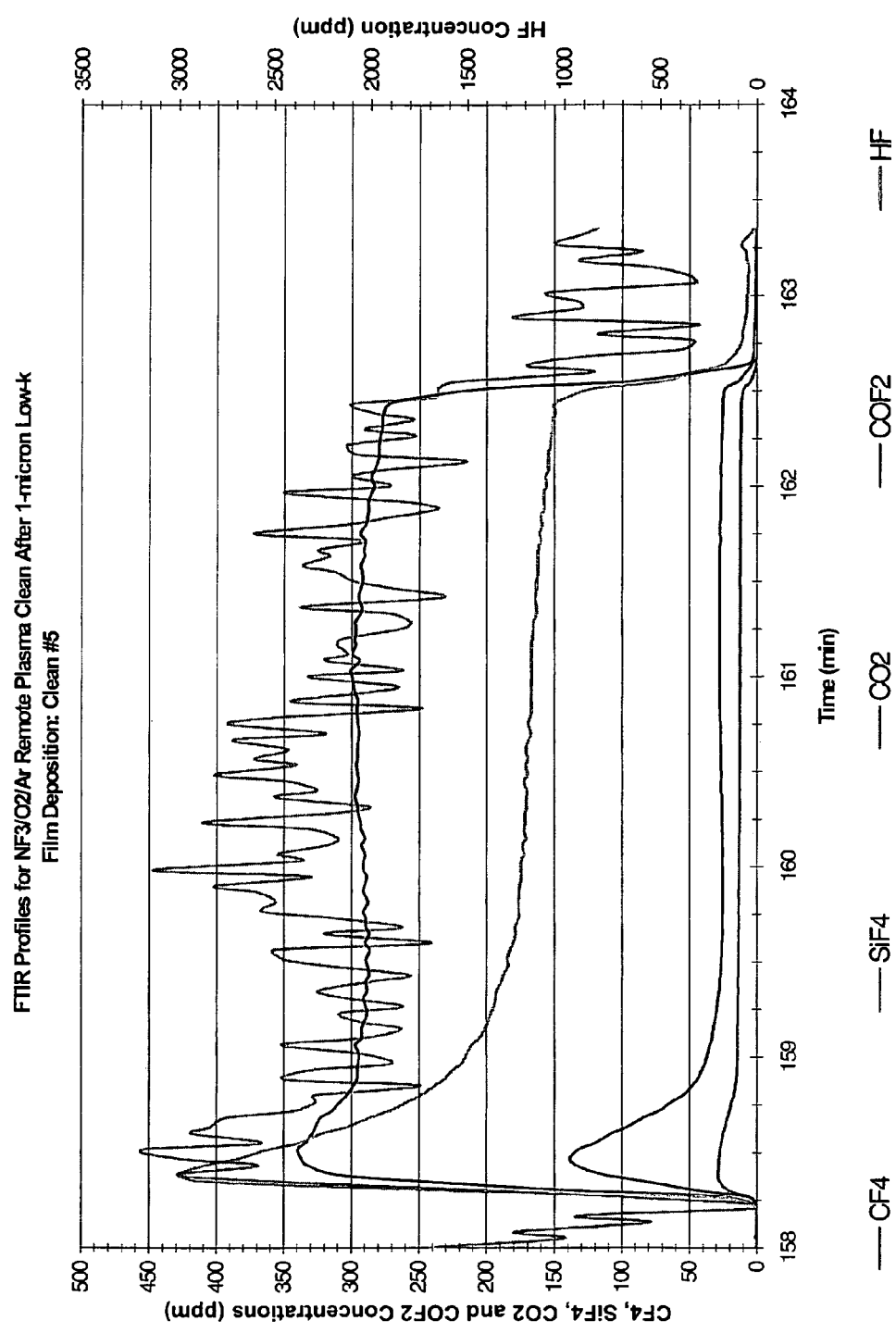
Figure 2b. FTIR Effluent Profiles for $NF_3/O_2/Ar$ Remote Clean with $O_2/NF_3$ Ratio = 4 and Pressure = 2.5 torr

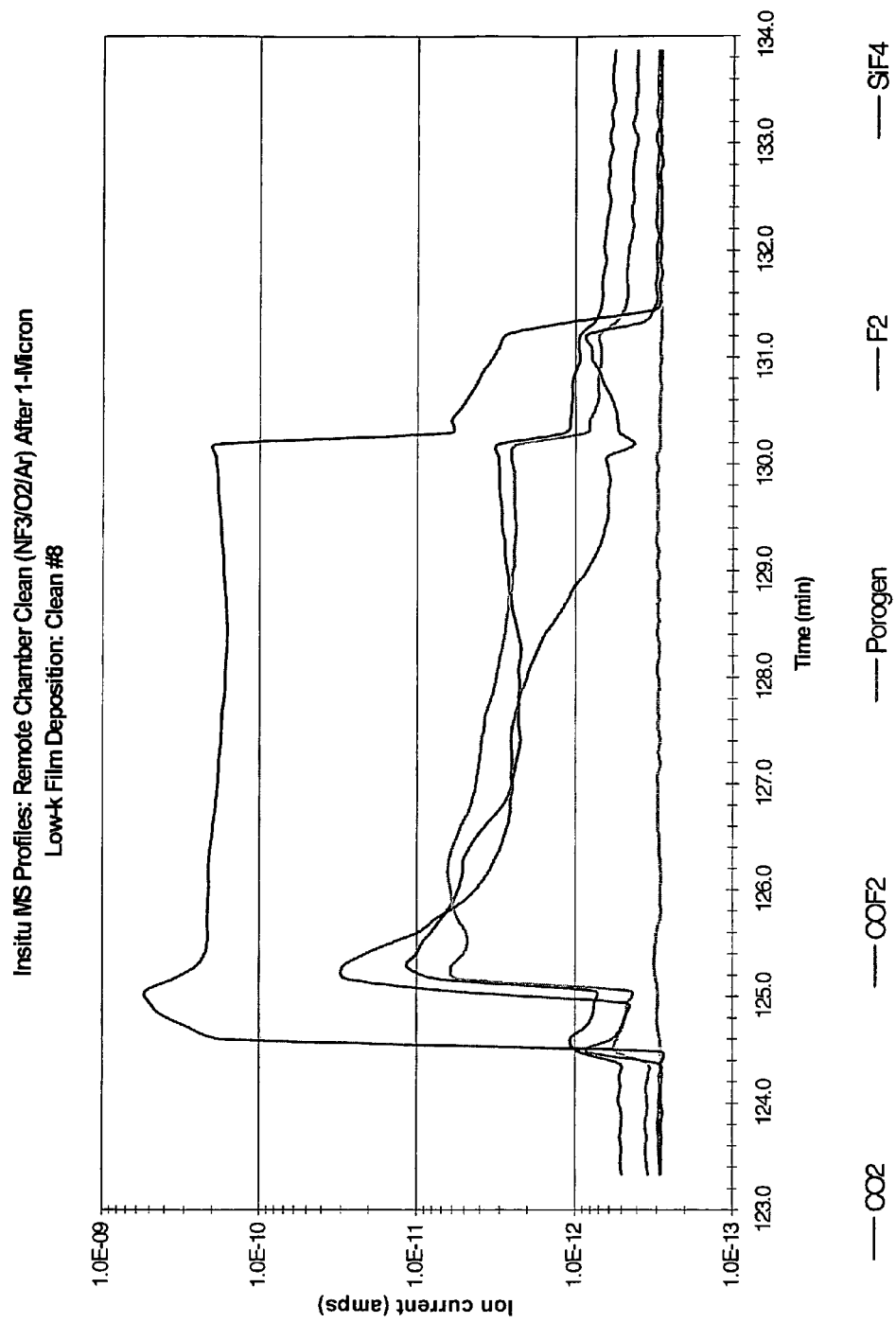
Figure 3a. QMS Effluent Profiles for $NF_3$/Ar (No Oxygen) Remote Plasma Clean with RF Assist at Pressure = 2.5 torr

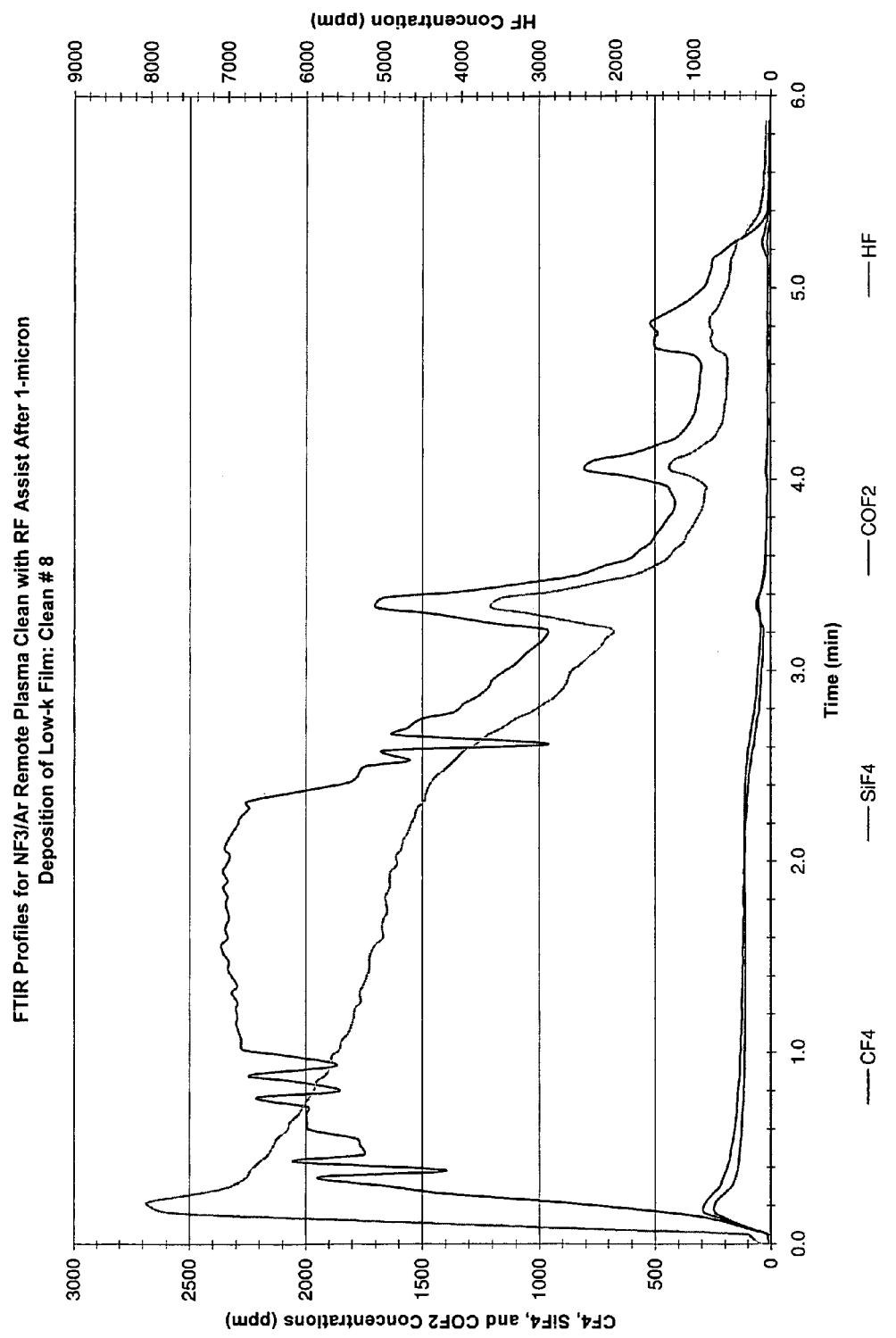
Figure 3b. FTIR Effluent Profiles for NF₃/Ar (No Oxygen) Remote Plasma Clean with RF Assist at Pressure = 2.5 torr

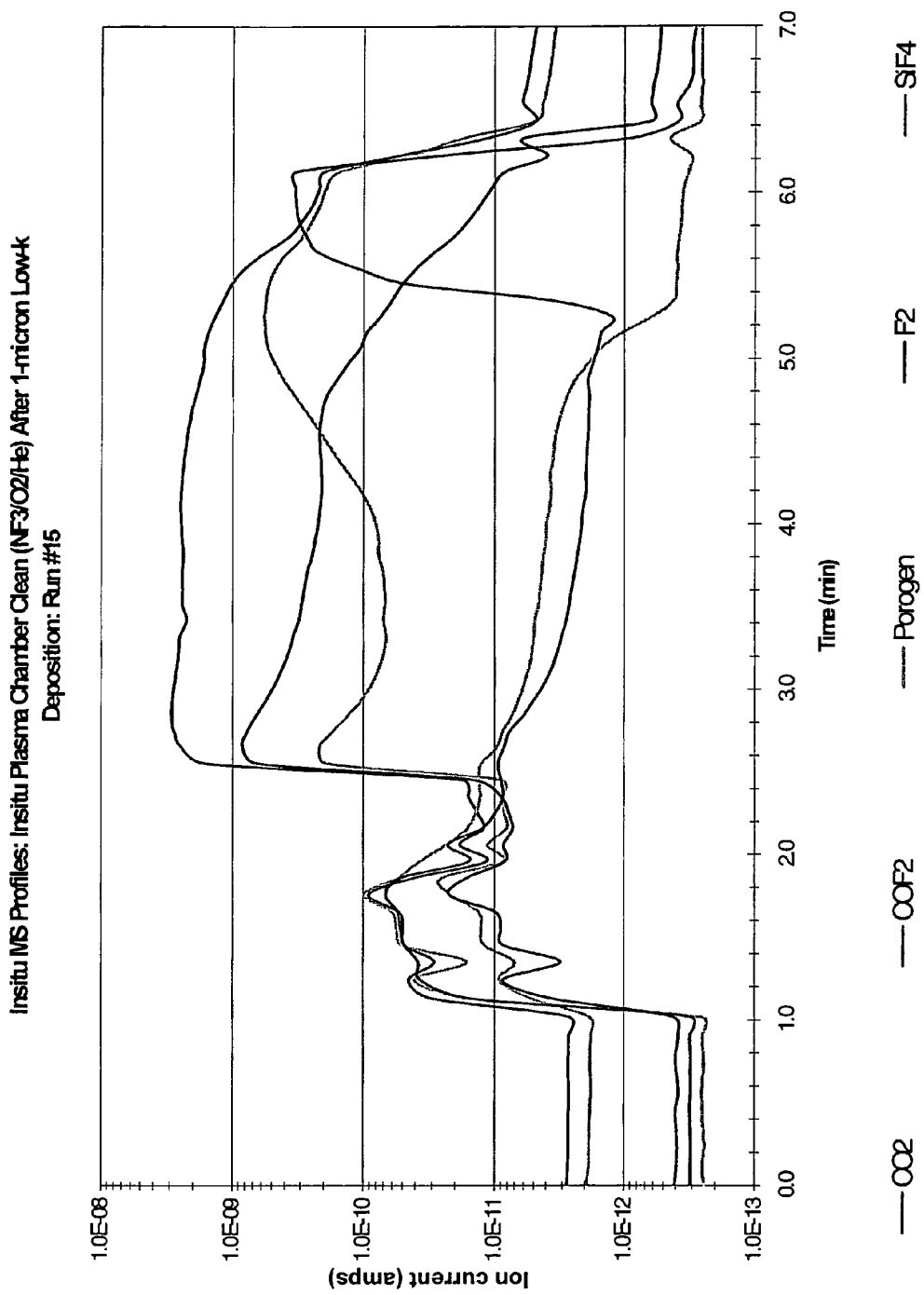
Figure 4a. QMS Effluent Profiles for $NF_3/O_2/He$ In Situ Clean with $O_2/NF_3$ Ratio = 3 and Pressure = 2.0 torr

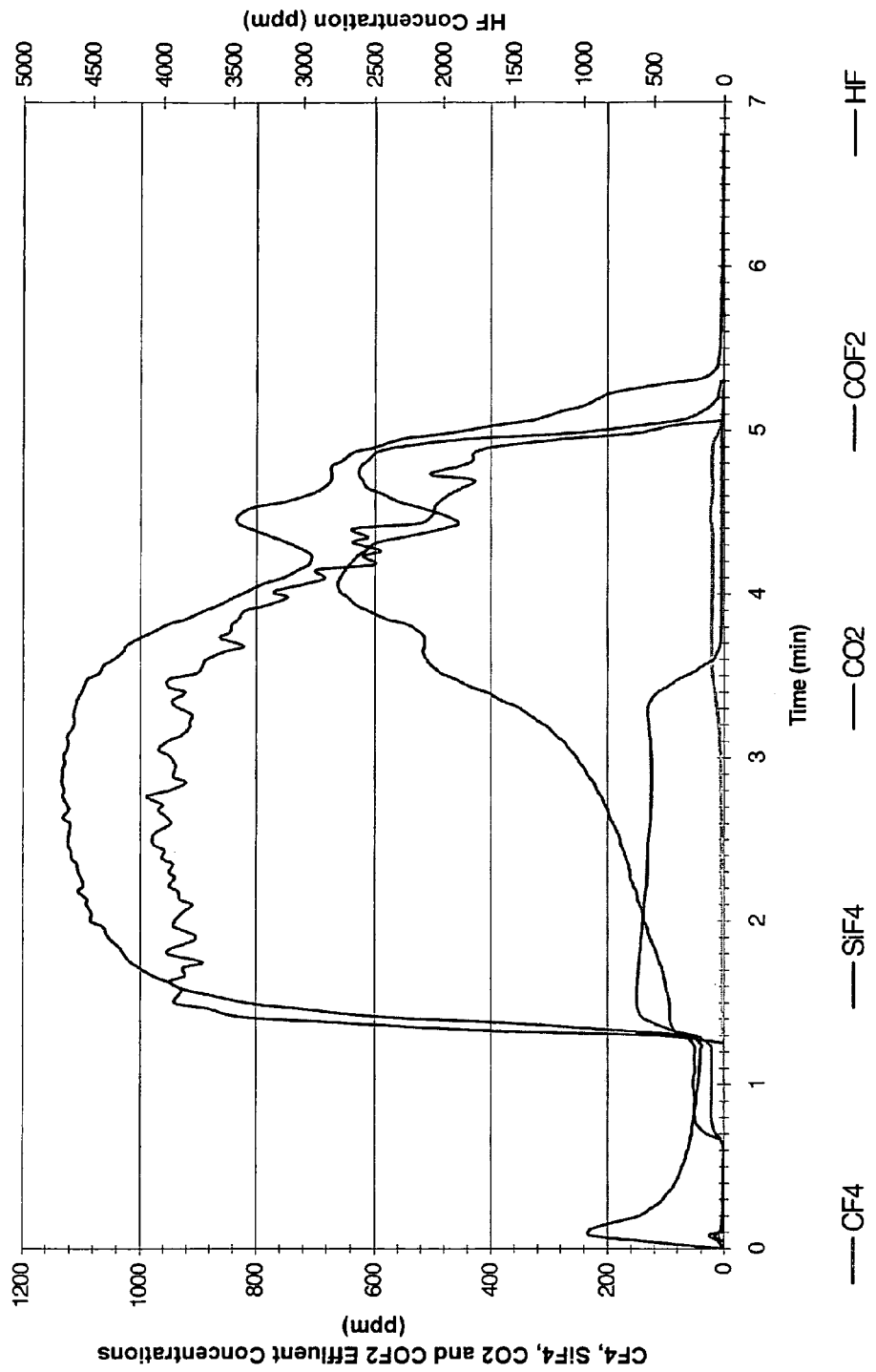
Figure 4b. FTIR Effluent Profiles for $NF_3/O_2/He$ In Situ Clean with $O_2/NF_3$ Ratio = 3 and Pressure = 2.0 torr

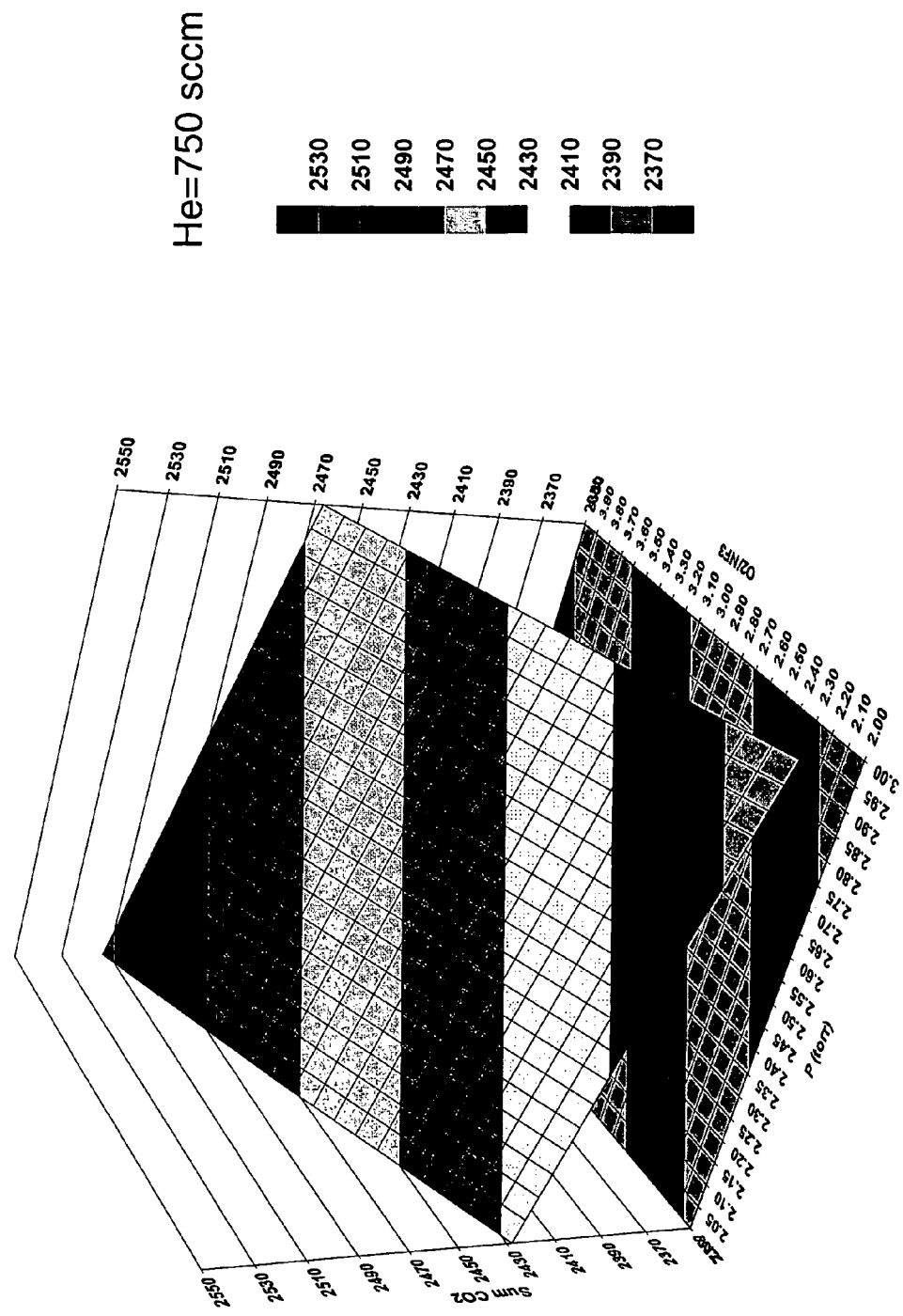
Figure 5a. CO$_2$ Effluent Volume as a Function of O$_2$/NF$_3$ Ratio and Chamber Pressure with Helium Flow Rate = 750 sccm

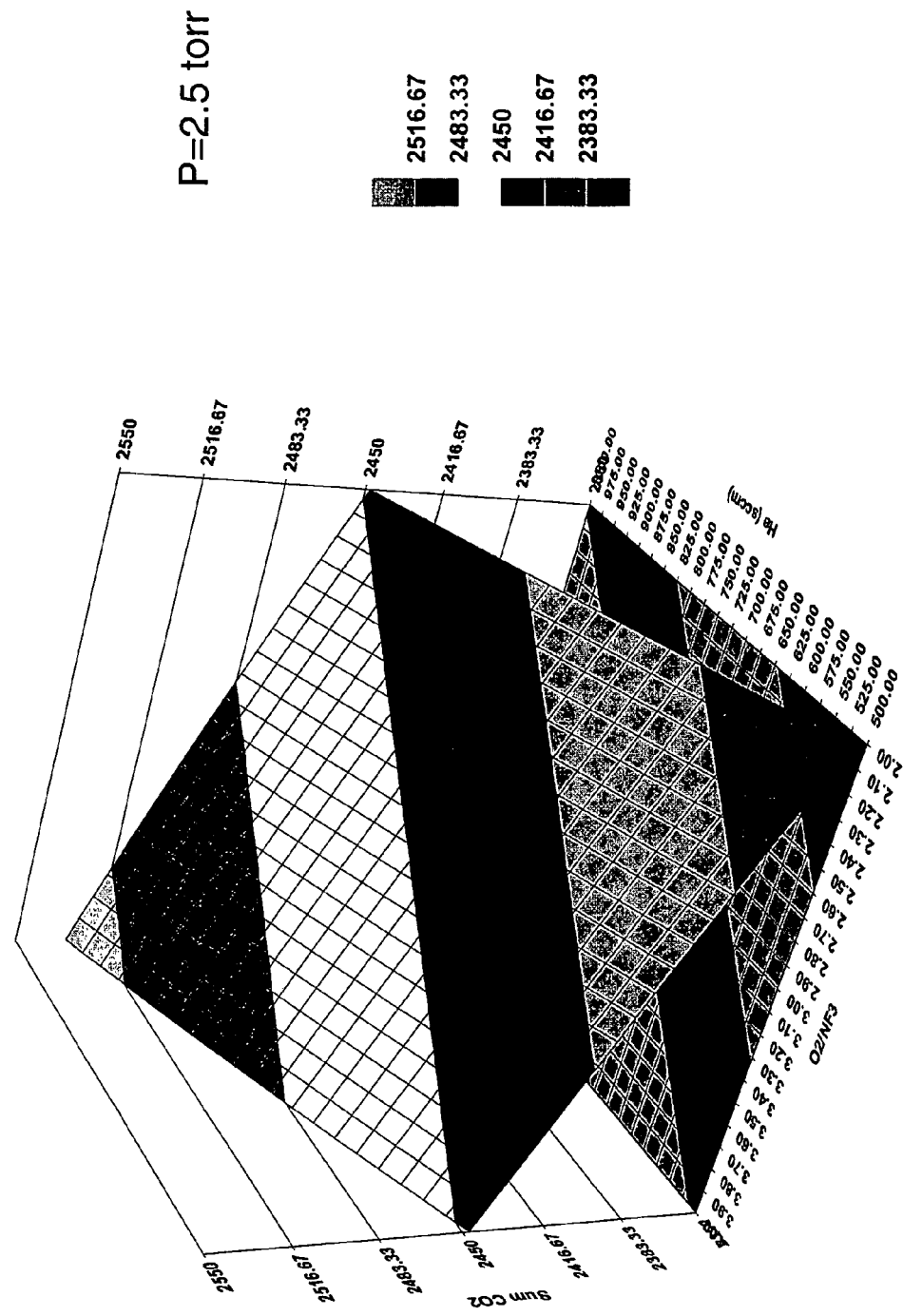
Figure 5b. $CO_2$ Effluent Volume as a Function of $O_2/NF_3$ Ratio and Helium Flow Rate at P = 2.5 torr

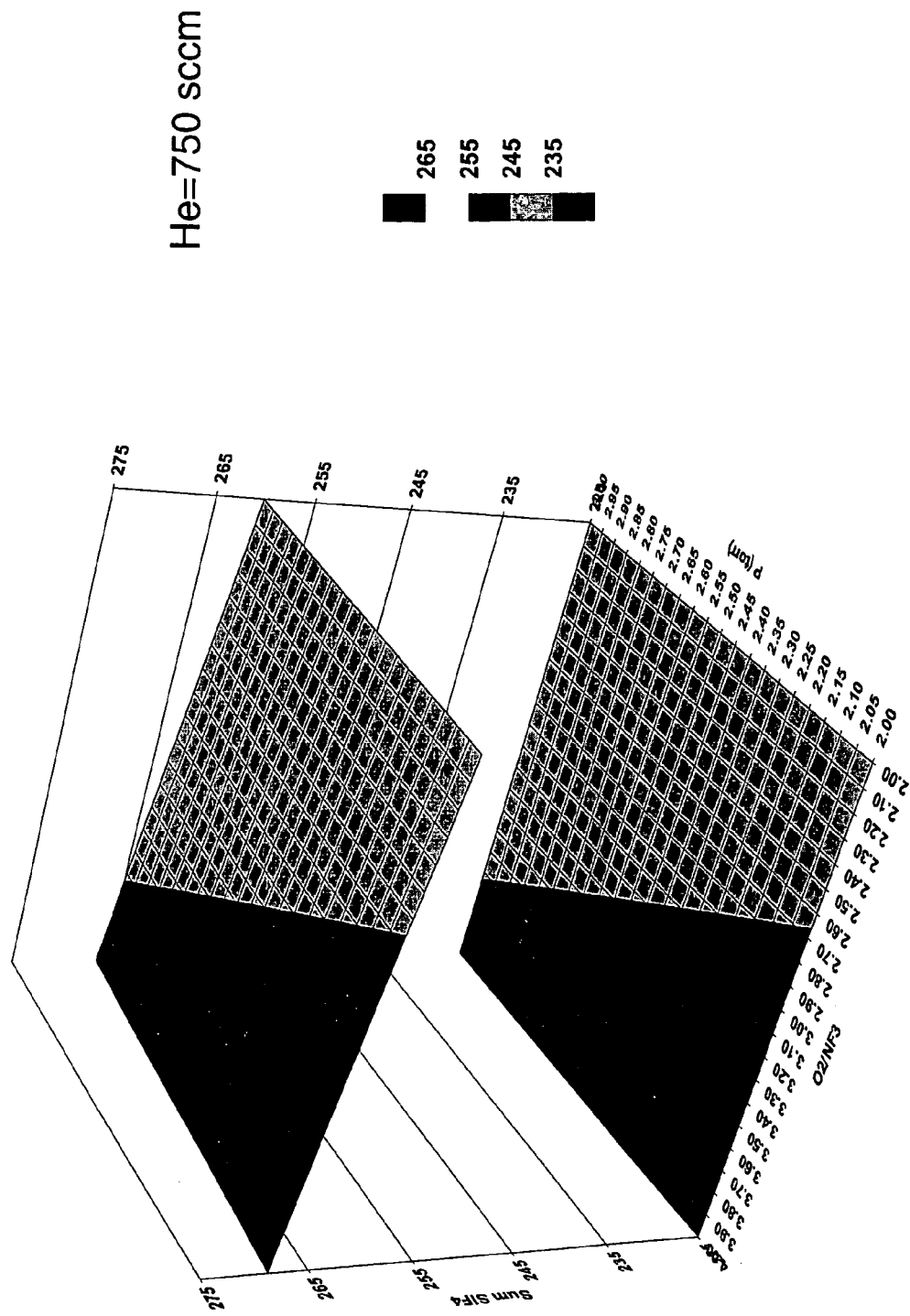
Figure 5c. SiF$_4$ Effluent Volume as a Function of O$_2$/NF$_3$ Ratio and Chamber Pressure with Helium Flow Rate = 750 sccm

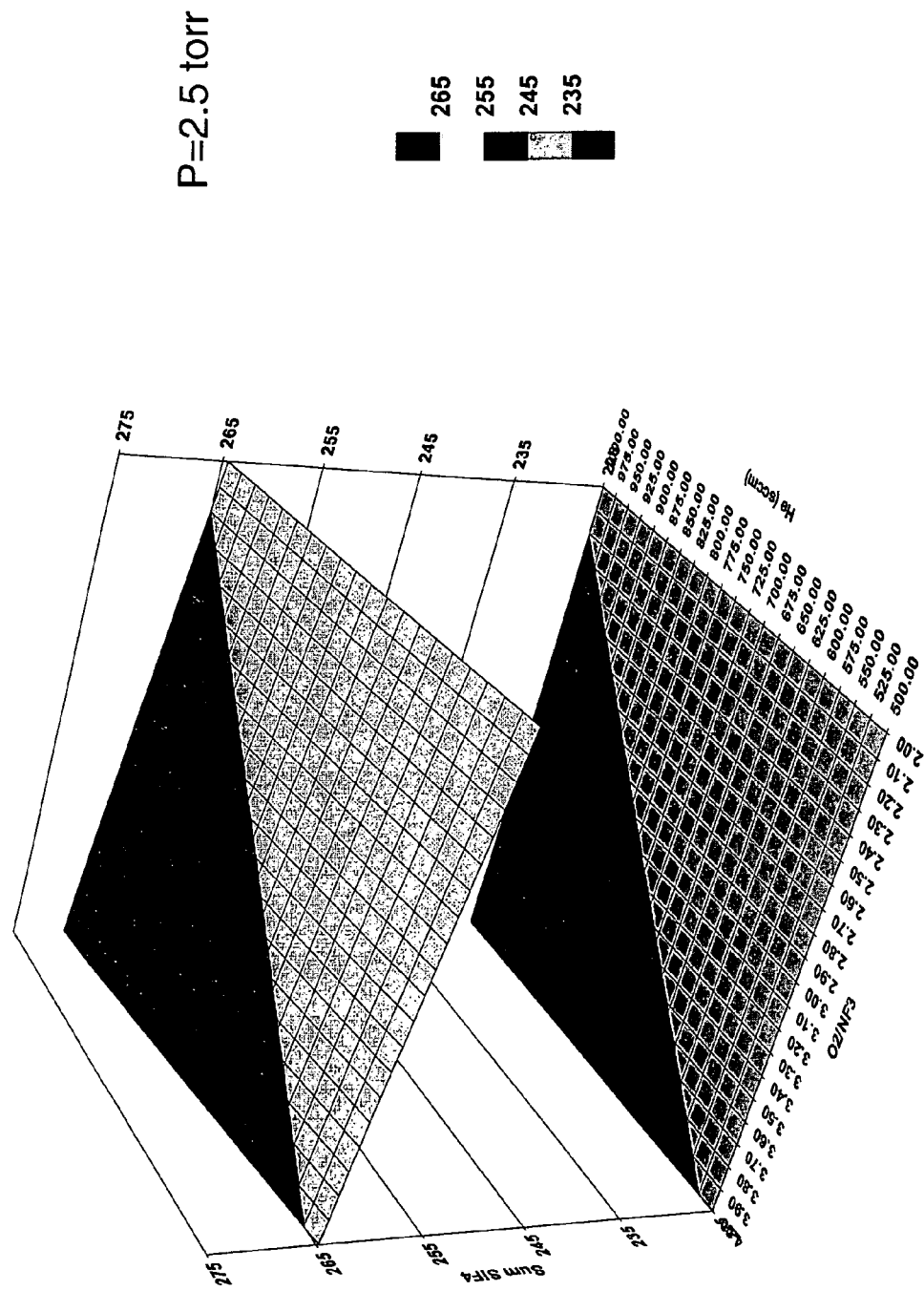
Figure 5d. SiF$_4$ Effluent Volume as a Function of O$_2$/NF$_3$ Ratio and Helium Flow Rate at P = 2.5 torr

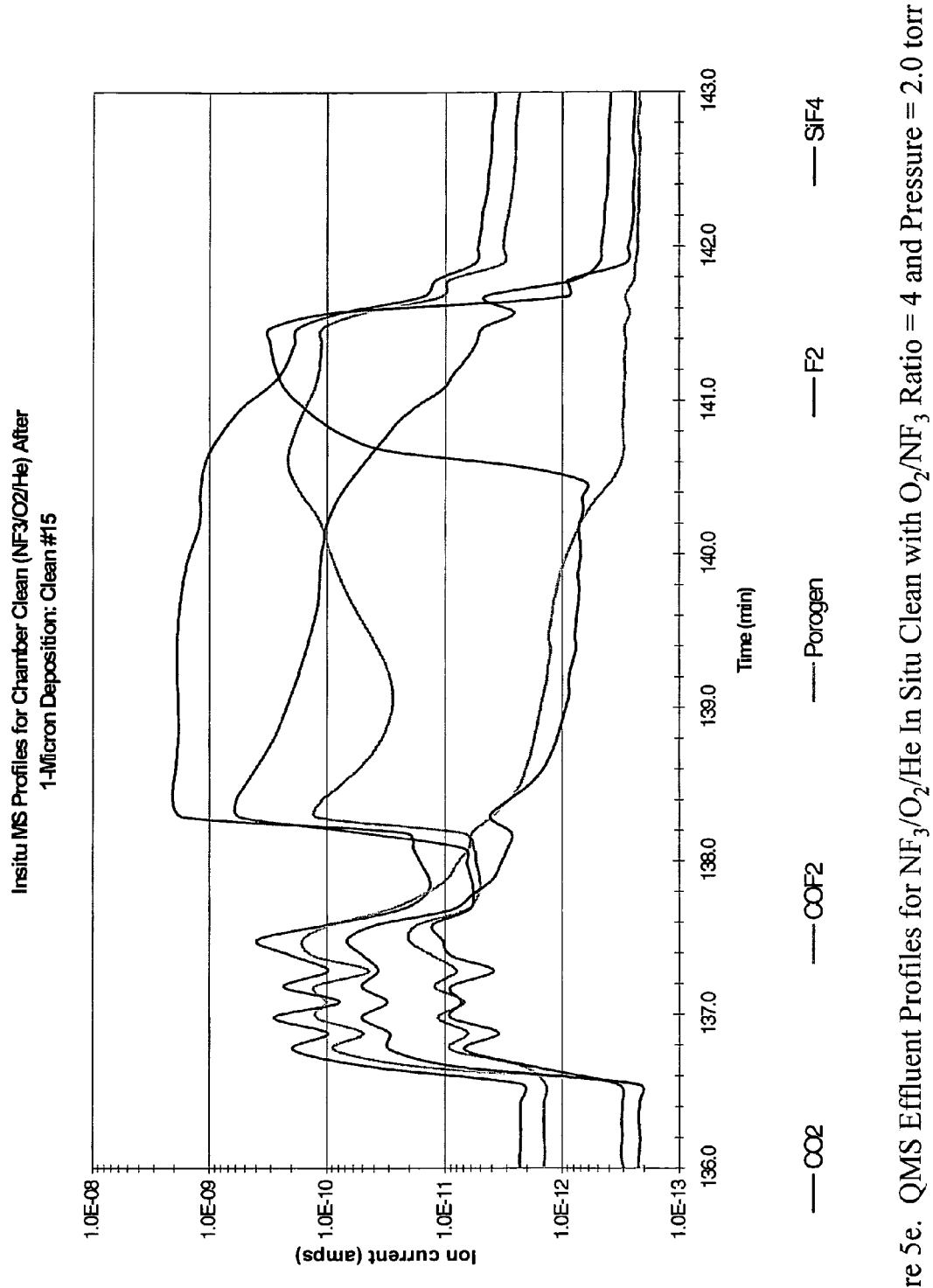
Figure 5e. QMS Effluent Profiles for $NF_3/O_2/He$ In Situ Clean with $O_2/NF_3$ Ratio = 4 and Pressure = 2.0 torr

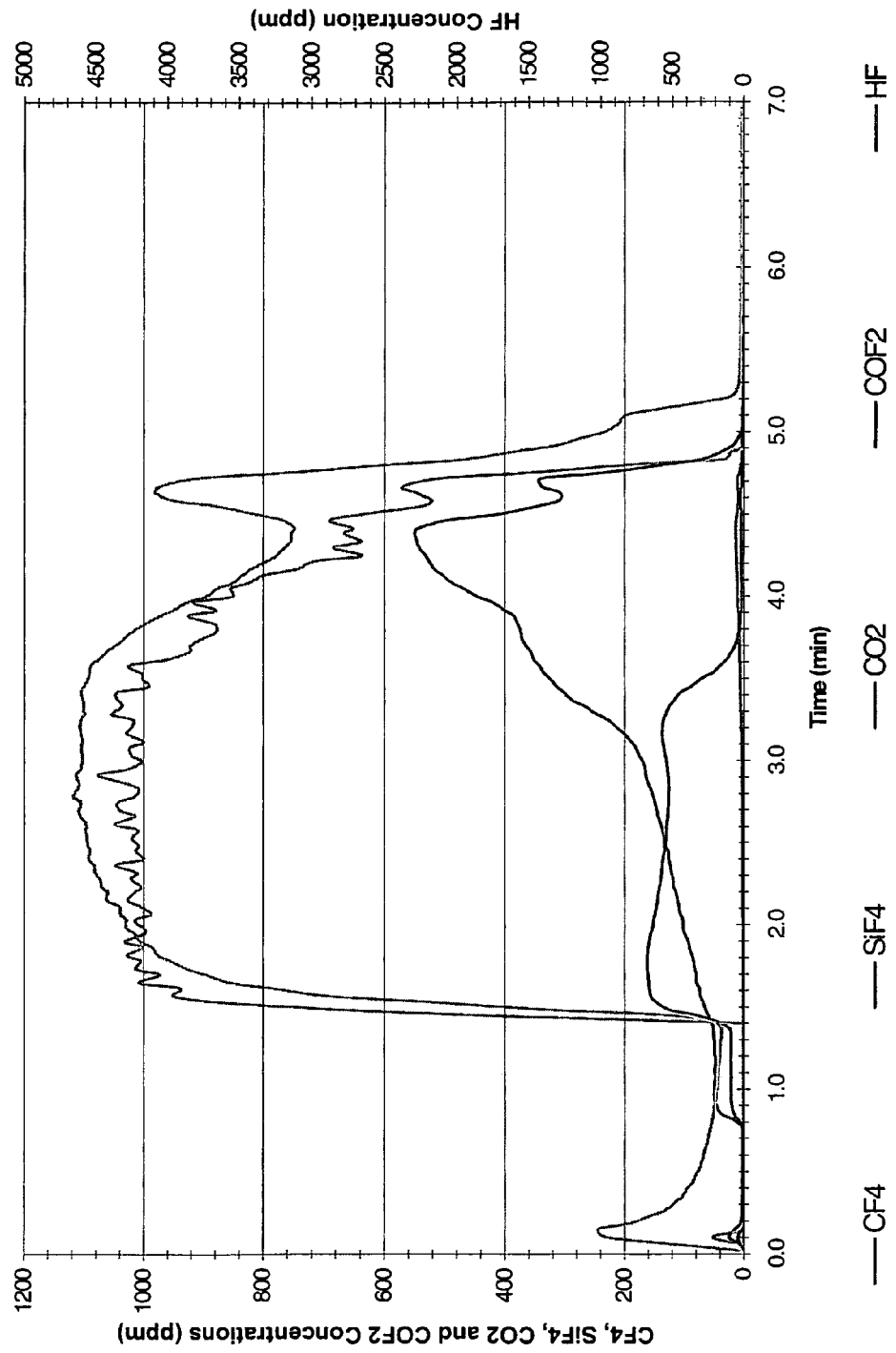
Figure 5f. FTIR Effluent Profiles for $NF_3/O_2/He$ In Situ Clean with $O_2/NF_3$ Ratio = 4 and Pressure = 2.0 torr

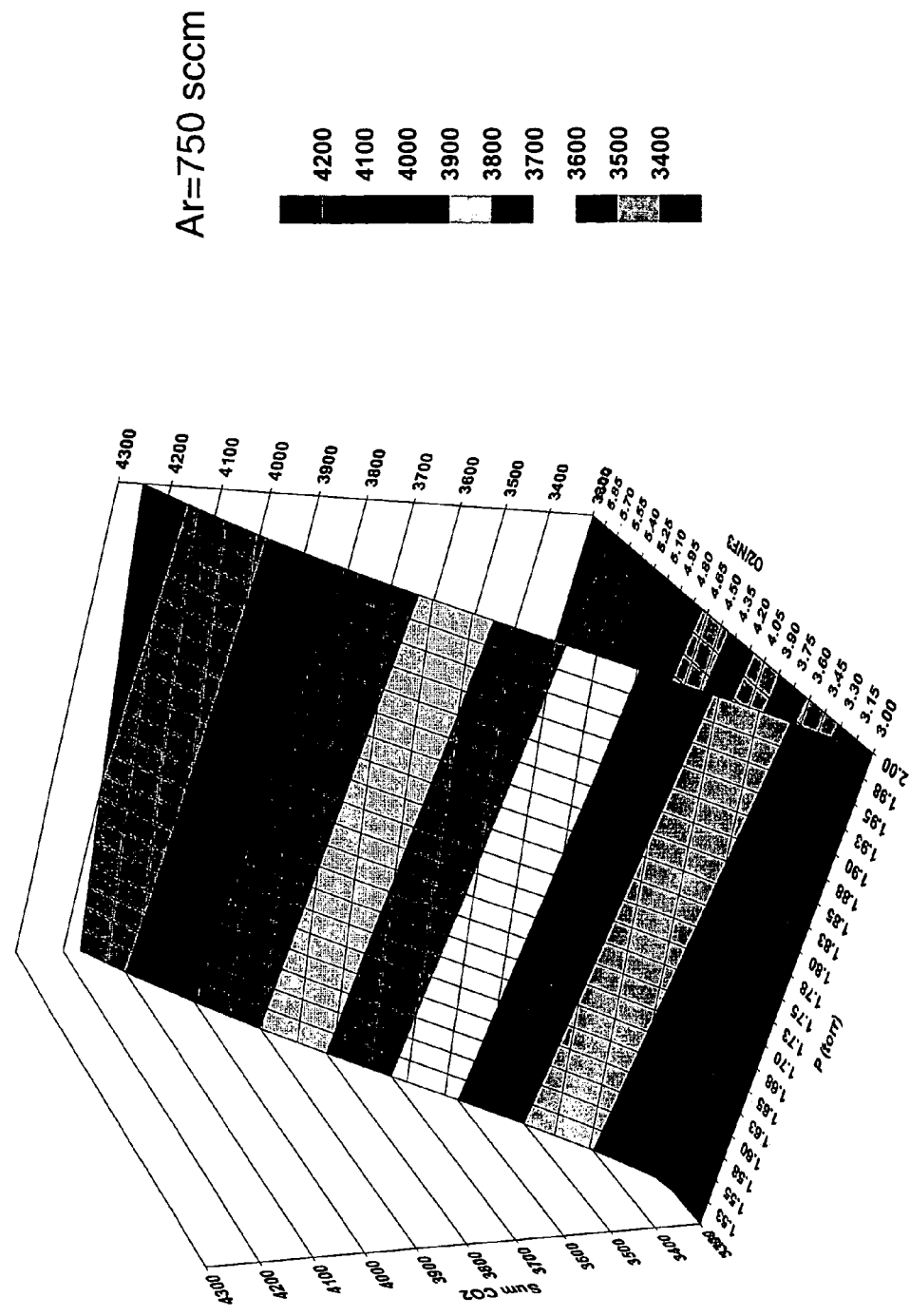
Figure 5g. $CO_2$ Effluent Volume as a Function of $O_2/NF_3$ Ratio and Chamber Pressure with Argon Flow Rate = 750 sccm

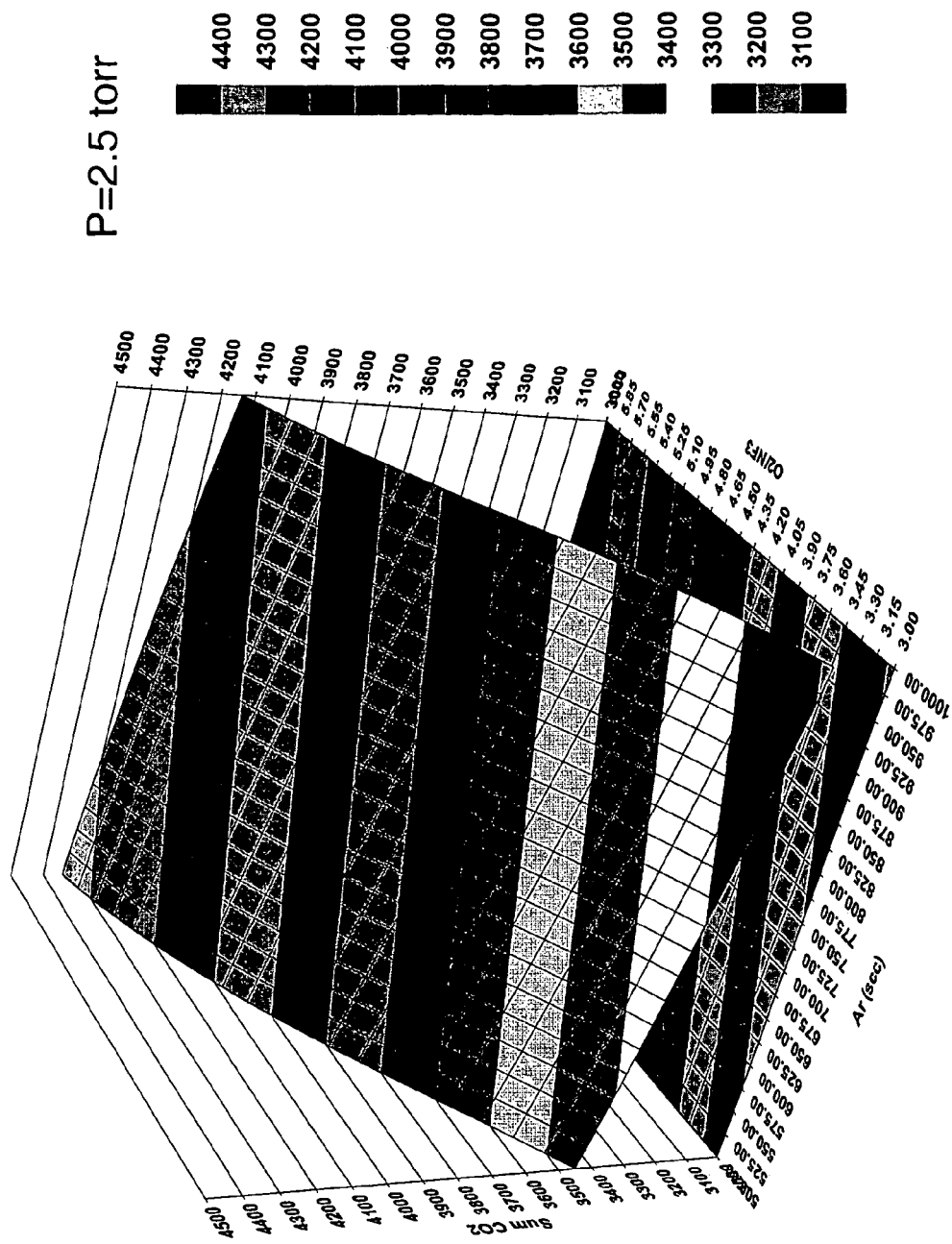
Figure 5h. $CO_2$ Effluent Volume as a Function of $O_2/NF_3$ Ratio and Argon Flow Rate at P = 2.5 torr

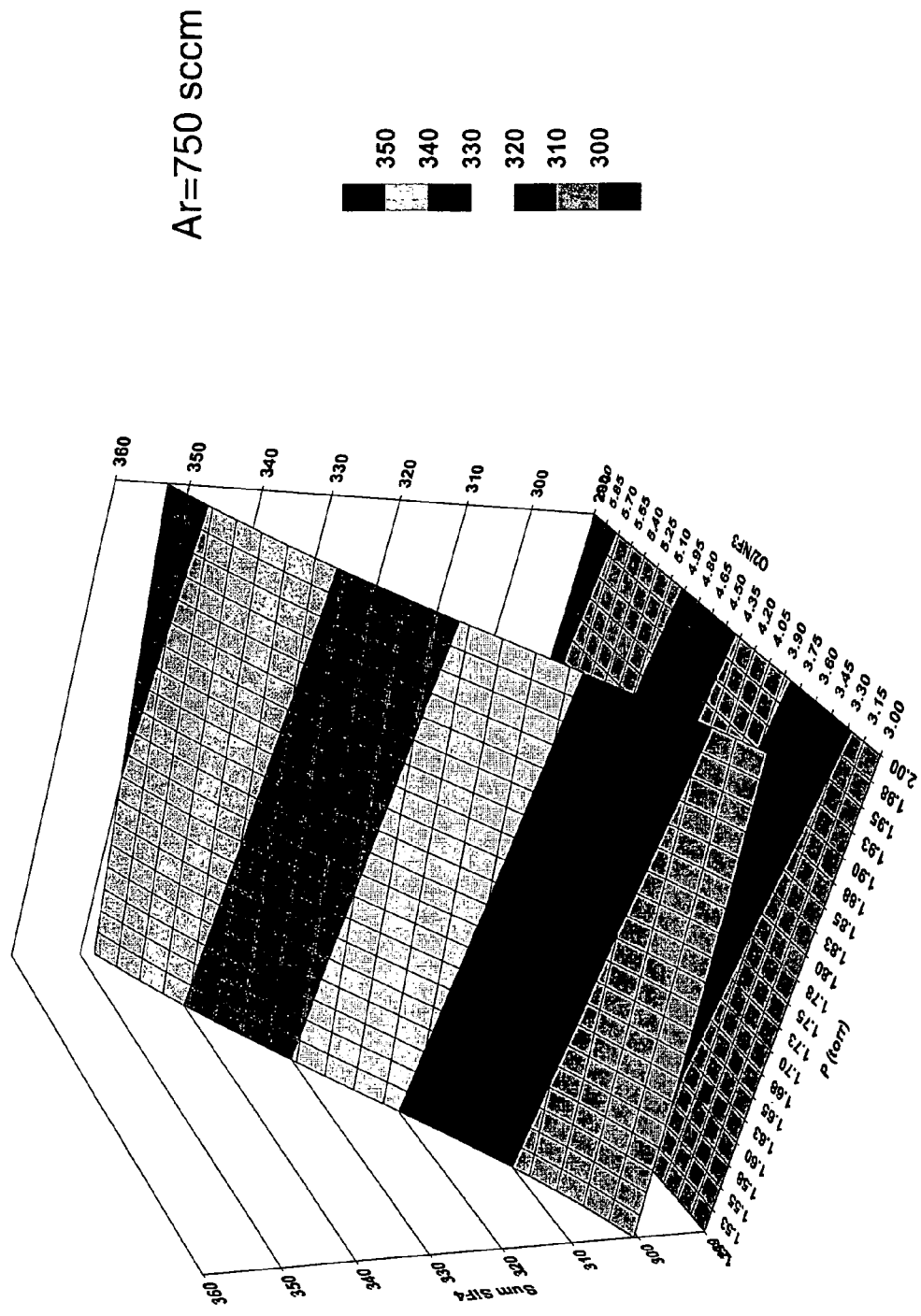
Figure 5i. SiF$_4$ Effluent Volume as a Function of O$_2$/NF$_3$ Ratio and Chamber Pressure with Argon Flow Rate = 750 sccm

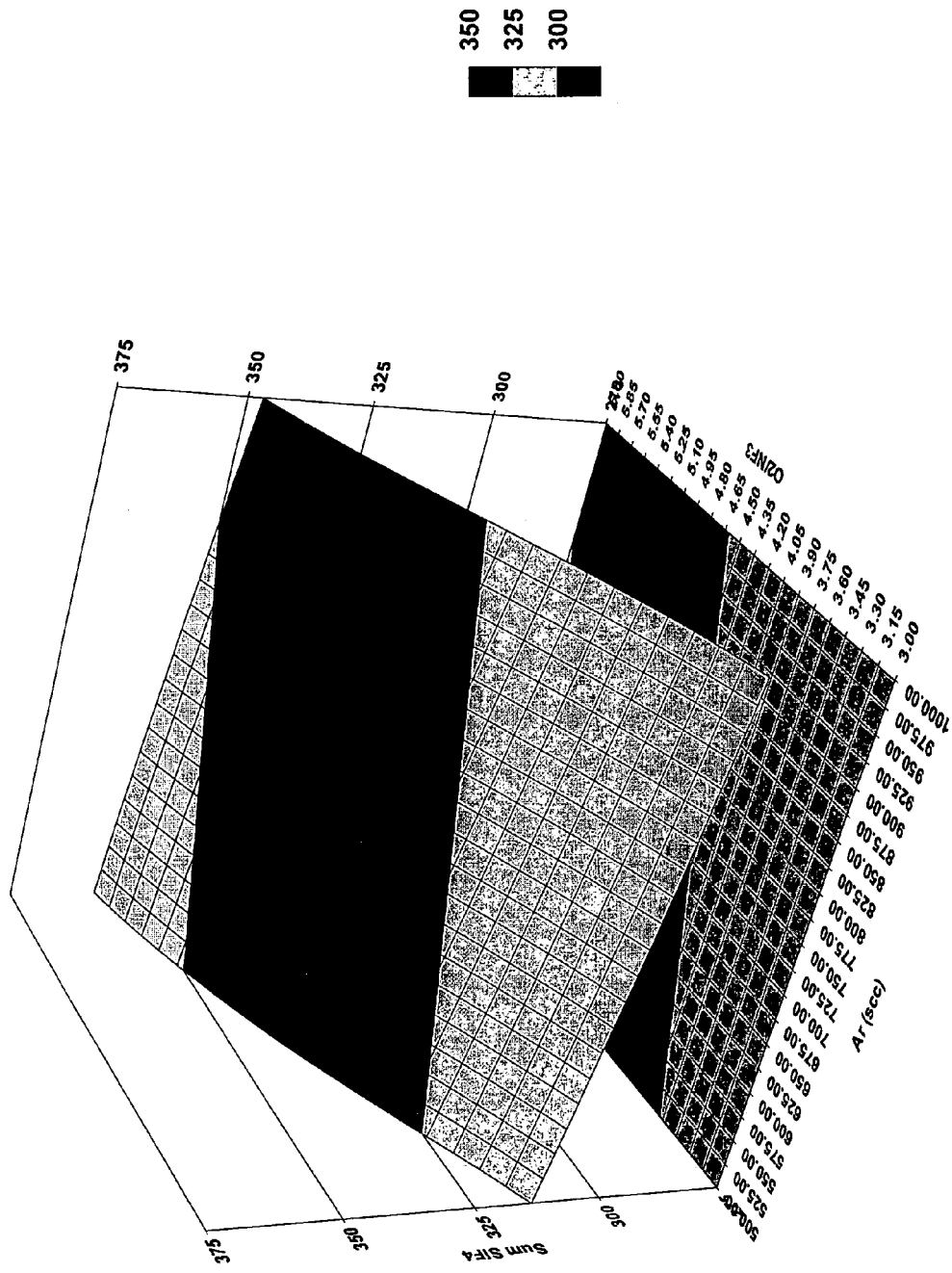
Figure 5j. SiF$_4$ Effluent Volume as a Function of O$_2$/NF$_3$ Ratio and Argon Flow Rate at P=2.5 torr

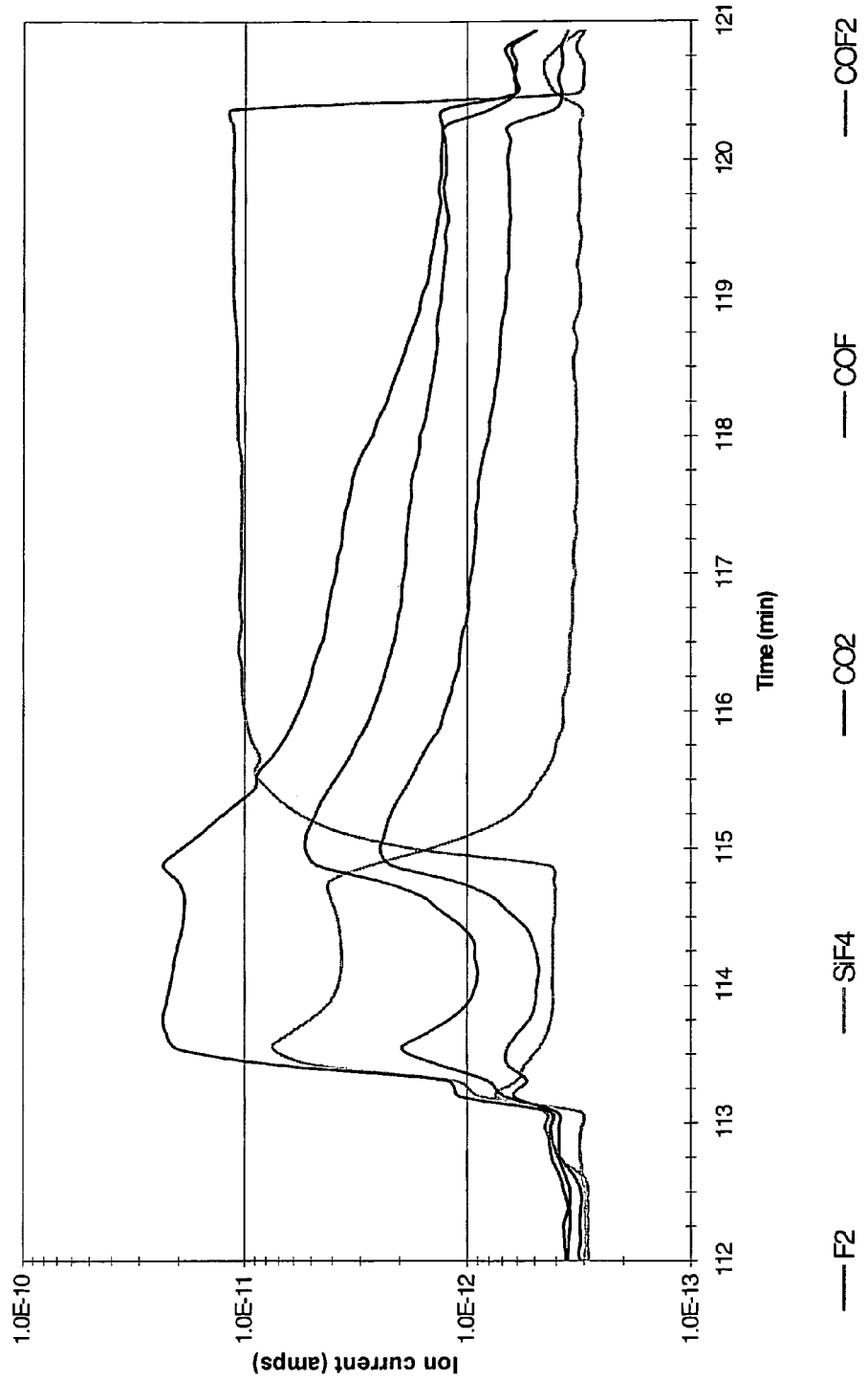
Figure 5k. QMS Effluent Profiles for $NF_3/O_2/Ar$ In Situ Clean with $O_2/NF_3$ Ratio = 4 and Pressure = 2.0 torr

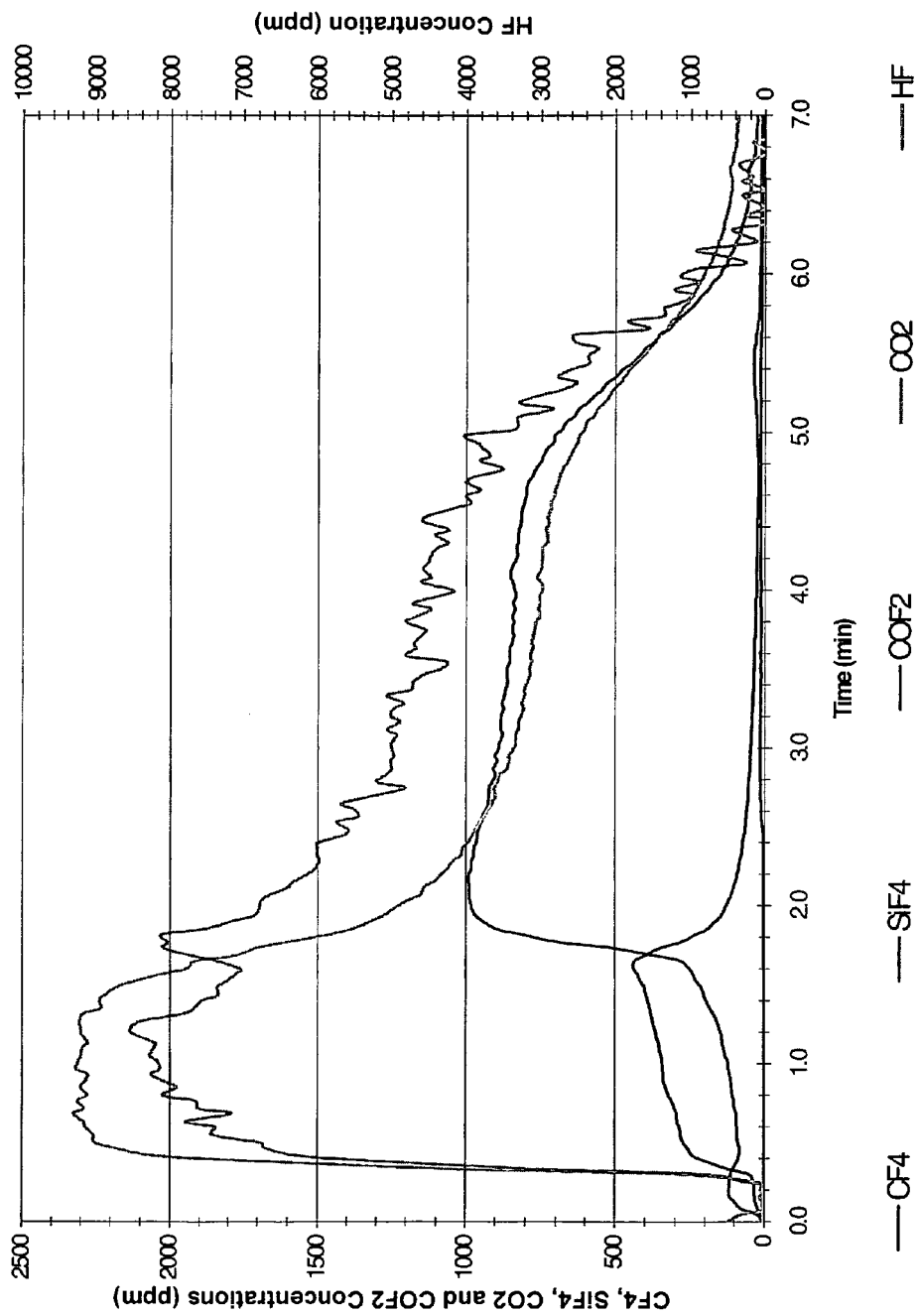
Figure 51. FTIR Effluent Profiles for $NF_3/O_2/Ar$ In Situ Clean with $O_2/NF_3$ Ratio = 4 and Pressure = 2.0 torr

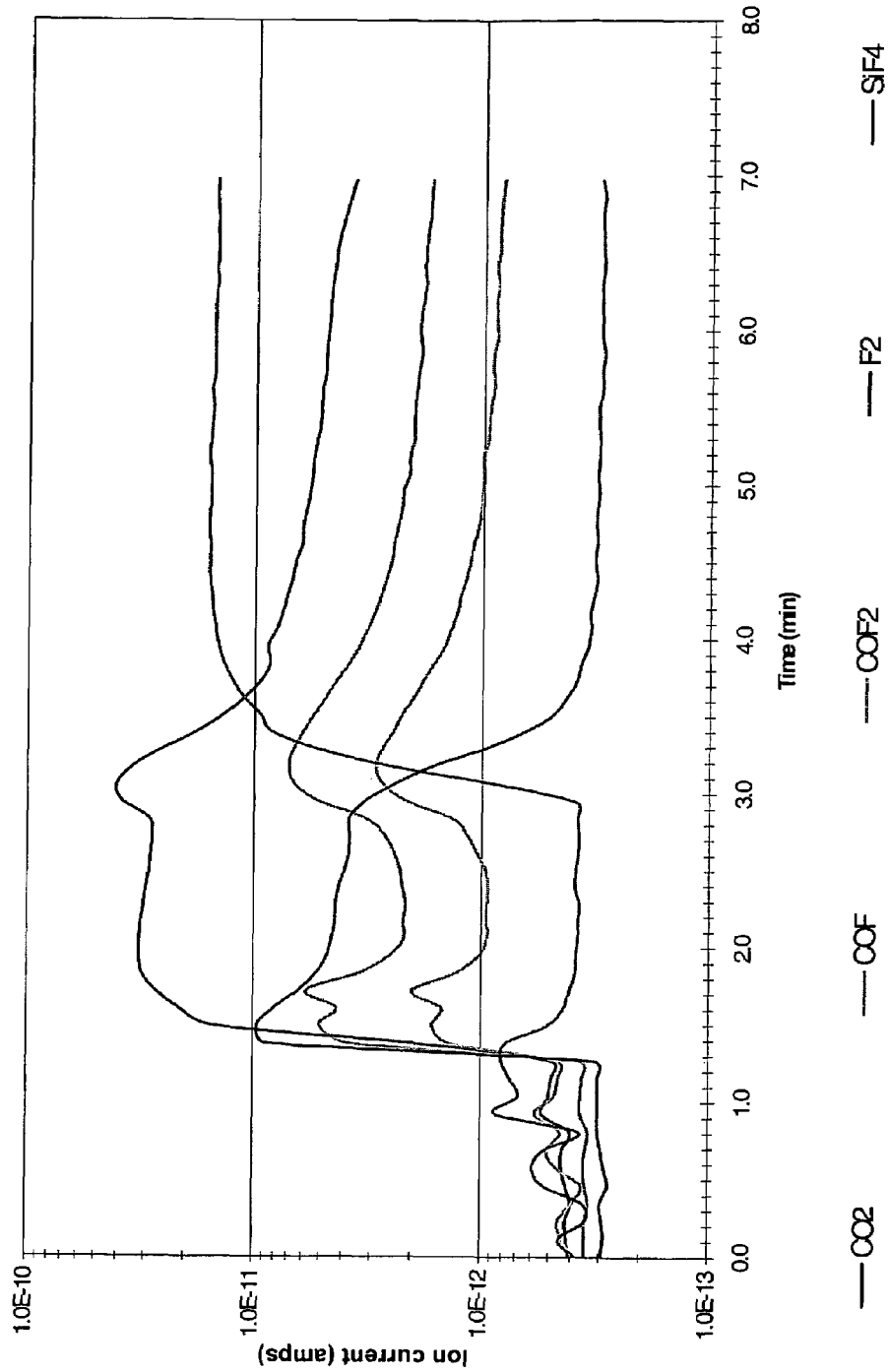
Figure 6a. QMS Effluent Profiles for $NF_3/O_2/Ar$ Remote Clean with RF Assist at $O_2/NF_3$ Ratio = 4 and Pressure = 2.0 torr

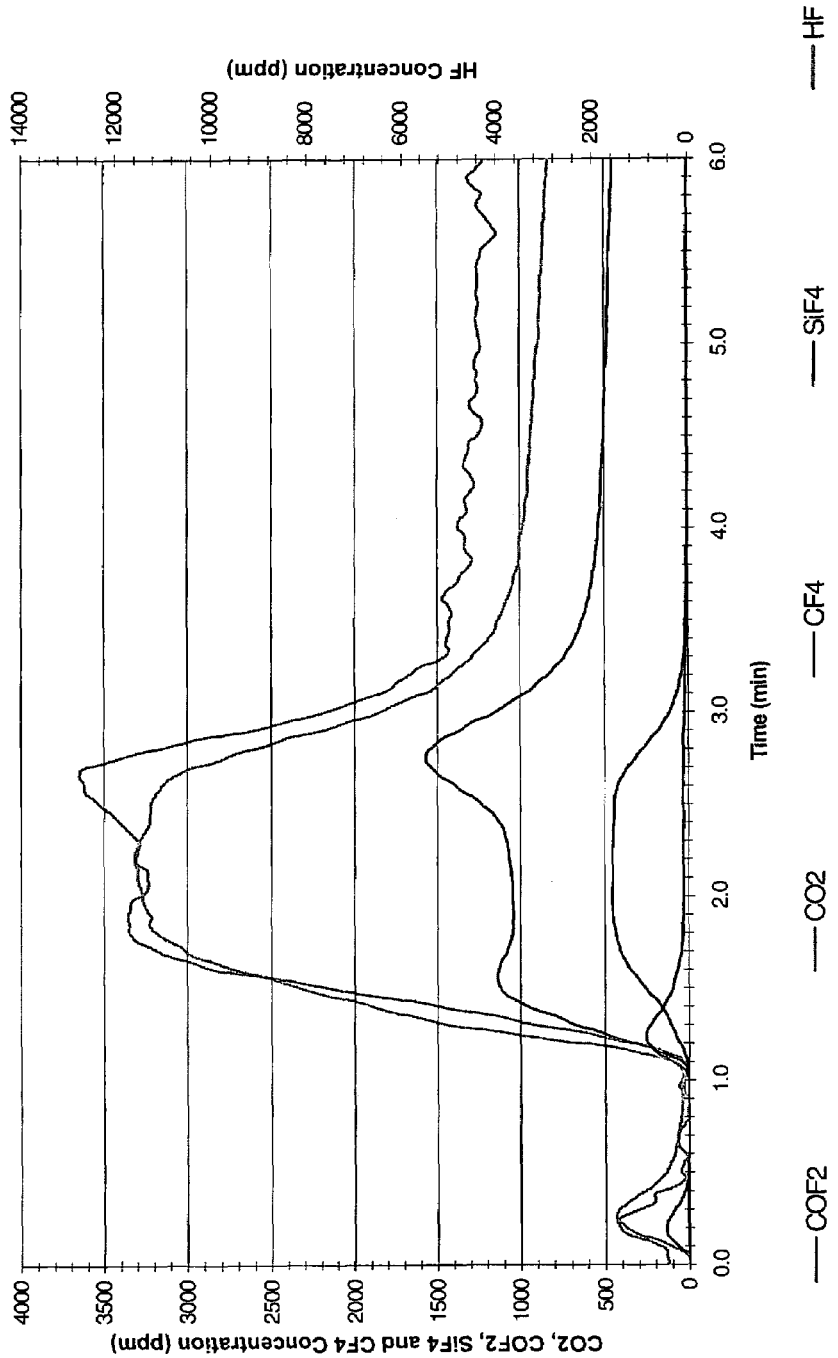
Figure 6b. FTIR Effluent Profiles for $NF_3/O_2/Ar$ Remote Clean with RF Assist at $O_2/NF_3$ Ratio = 4 and Pressure = 2.0 torr

METHOD FOR REMOVING CARBON-CONTAINING RESIDUES FROM A SUBSTRATE

CROSS-REFERENCE TO RELATED APPLICATIONS

This application claims the benefit of U.S. Provisional Application No. 60/590,628 filed 23 Jul. 2004.

BACKGROUND OF THE INVENTION

In the manufacture of semiconductor integrated circuits (IC), opto-electronic devices, and microelectro-mechanical systems (MEMS), multiple steps of thin film deposition are performed in order to construct several complete circuits (chips) and devices on monolithic substrates or wafers. Each wafer is often deposited with a variety of thin films such as, but not limited to, diffusion barrier layers such as binary and/or transition metal ternary compounds; conductor films, such as, but not limited to, tungsten, copper, and aluminum; semiconductor films, such as, but not limited to, doped and undoped poly-crystalline silicon (poly-Si), and doped and undoped (intrinsic) amorphous silicon (a-Si); dielectric films, such as, but not limited to, silicon dioxide ($SiO_2$), undoped silicon glass (USG), boron doped silicon glass (BSG), phosphorus doped silicon glass (PSG), borophosphorosilicate glass (BPSG), silicon nitride ($Si_3N_4$), and silicon oxynitride (SiON); low dielectric constant (low-k) dielectric films, such as, but not limited to, fluorine doped silicate glass (FSG), silicon oxide or carbon-doped organosilicate glass (OSG); photoresist films; and anti-reflective-coating (ARC) films comprising organic or inorganic materials.

Materials of particular interest in the semiconductor industry are composite organosilicate films. It is well known that reducing the overall density of the material may decrease the dielectric constant (k) of the material. One method of reducing the density of the material may be through the introduction of pores. Porous composite organosilicate films can be produced by a chemical vapor deposition (CVD) process or other means using a precursor mixture containing a pore-forming precursor or porogen (typically one or more carbon-containing compounds) and a structure-forming precursor (typically organosilanes and/or organosiloxanes). In certain instances, the carbon-containing residues result from the deposition of a structure-forming precursor and a pore-forming precursor. Examples of structure-forming and/or pore-forming precursors are provided for example in U.S. Pat. Nos. 6,846,525; 6,716,770; 6,583,048, and published U.S. Pat. Publication Nos. 2004/0241463; 2004/0197474; 2004/0175957; 2004/0175501; 2004/0096672; and 2004/0096593, which are incorporated herein by reference in their entireties. Once the composite organosilicate film has been deposited, at least a portion of the pore-forming precursor may be removed to provide a porous film.

Examples of structure-former precursors include silica-containing compounds such as organosilanes and organosiloxanes. Suitable organosilanes and organosiloxanes include, e.g.: (a) alkylsilanes represented by the formula $R^1{}_nSiR^2{}_{4-n}$, where n is an integer from 1 to 3; $R^1$ and $R^2$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyltriethoxysilane, methyldiethoxysilane, triethoxysilane, trimethylphenoxysilane and phenoxysilane); (b) a linear organosiloxane represented by the formula $R^1(R^2{}_2SiO)_nSiR^2{}_3$ where n is an integer from 1 to 10, or a cyclic organosiloxane represented by the formula $(R^1R^2SiO)_n$, where n is an integer from 2 to 10 and $R^1$ and $R^2$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^2(SiR^1R^2)_nR^2$ where n is an integer from 2 to 10, or cyclic organosilane represented by the formula $(SiR^1R^2)_n$, where n is an integer from 3 to 10, and $R^1$ and $R^2$ are as defined above (e.g., 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane). In certain embodiments, the organosilane/organosiloxane is a cyclic alkylsilane, a cyclic alkylsiloxane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene, octamethyltetracyclosiloxane (OMCTS), or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate, and di-tert-butoxydiacetoxysilane.

The pore-former precursor may be a hydrocarbon compound, preferably having from 1 to 13 carbon atoms. Examples of these compounds include, but are not limited to, alpha-terpinene, limonene, cyclohexane, gamma-terpinene, camphene, dimethylhexadiene, ethylbenzene, norbornadiene, cyclopentene oxide, 1,2,4-trimethylcyclohexane, 1,5-dimethyl-1,5-cyclooctadiene, camphene, adamantane, 1,3-butadiene, substituted dienes, alpha-pinene, beta-pinene, and decahydronaphthelene. Further examples of pore-former precursors may include labile organic groups. Some examples of compounds containing labile organic groups include the compounds disclosed in U.S. Pat. No. 6,171,945, which is incorporated herein by reference in its entirety. Yet another example of a pore-former precursors could also be a decomposable polymers. The decomposable polymer may be radiation decomposable. The term "polymer", as used herein, also encompasses the terms oligomers and/or copolymers unless expressly stated to the contrary. Radiation decomposable polymers are polymers that decompose upon exposure to radiation, e.g., ultraviolet, X-ray, electron beam, or the like. Examples of these polymers include polymers that have an architecture that provides a three-dimensional structure such as, but not limited to, block copolymers, i.e., diblock, triblock, and multiblock copolymers; star block copolymers; radial diblock copolymers; graft diblock copolymers; cografted copolymers; dendrigraft copolymers; tapered block copolymers; and combinations of these architectures.

Further examples of degradable polymers are found in U.S. Pat. No. 6,204,202, which is incorporated herein by reference in its entirety.

In certain instances, a single compound may function as both the structure-former and pore-former within the porous OSG film. That is, the structure-former precursor and the pore-former precursor are not necessarily different compounds, and in certain embodiments, the pore-former is a part of (e.g., covalently bound to) the structure-former precursor.

While the deposition process desirably forms thin films on a substrate (typically a silicon wafer), the reactions that form these films also occurs non-productively on exposed surfaces inside of the process chamber leaving a large amount of residues on the chamber walls, the showerhead, and the foreline downstream of the process chamber. These residues typically contain carbon which is referred to herein as carbon-containing residues. Additional species that may also be present include, for example, silicon from the precursor mixture and/or fluorine from exposure to fluorinated gas-based plasmas used for cleaning and/or fluorine-containing precursors. Accumulation of the carbon-containing residues inside the chamber may result in particle shedding, degradation of deposition uniformity, and processing drifts that can affect subsequent depositions. These effects can lead to defects in the deposited structures and device failure. Therefore, periodic cleaning of the process chamber, also referred to as chamber cleaning, is necessary. These residues have to be removed in order to ensure the integrity (uniformity, composition purity, reproducibility) of the composite organosilicate films subsequently deposited. In some cases this carbon-containing residue may be present in the form of oligomers and polymers thus making residue removal more challenging.

Plasma cleaning using fluorinated gas-based plasmas is commonly used to clean the chamber between depositions. Fluorinated gases typically used include $NF_3$, $C_2F_6$, $CF_4$, $CHF_3$, $F_2$, and a variety of other species to provide a convenient source of fluorine atoms (F) in a chamber cleaning process. Some types of fluorinated gases are relatively easy to handle since these gases are non-corrosive and unreactive with materials of construction or atmospheric gases under ambient conditions. Process chambers are typically cleaned using a $C_2F_6/O_2$ or $NF_3$-based plasma etch process. It has been found, however, that plasmas containing fluorinated gases alone cannot effectively remove all of the carbon-containing residues that deposit on the interior surfaces of the process chamber during the co-deposition processes indicated above that are required to produce composite organosilicate materials.

BRIEF SUMMARY OF THE INVENTION

A process for removing carbon-containing residues from a surface of a substrate that is at least partially coated with the carbon-containing residues is described herein. In one aspect, there is provided a process for removing carbon-containing residues from a surface of a substrate comprising: providing a process gas comprising an oxygen source, a fluorine source, and optionally an additive gas wherein the molar ratio of oxygen to fluorine contained within the process gas ranges from about 1 to about 10; activating the process gas using one or more energy sources to provide reactive species; and contacting the surface of the substrate with the reactive species to volatilize and remove the carbon-containing residue from the surface In another aspect, there is provided a process for removing carbon-containing residues from a surface of a process chamber wherein the process chamber is used to deposit an composite organosilicate film comprising: providing the process chamber wherein the chamber comprises a surface at least partially coated with carbon-containing residues; providing a process gas comprising an oxygen source, a fluorine source, and optionally an additive gas wherein the molar ratio of oxygen to fluorine contained within the process gas ranges from about 1 to about 10; activating the process gas using one or more energy sources to form reactive species; contacting the residues with the reactive species to form at least one volatile product wherein the contacting step is conducted at a pressure of 5 torr or less; and removing the at least one volatile product from the process chamber.

In a further aspect, there is provided a process for removing carbon-containing residues from a surface of a process chamber wherein the process chamber is used to deposit a composite organosilicate film comprising: providing the process chamber wherein the chamber comprises a surface at least partially coated with carbon-containing residues; providing a process gas comprising an oxygen source, a fluorine source, and optionally an additive gas wherein the molar ratio of oxygen to fluorine contained within the process gas ranges from about 1 to about 10; activating the process gas by applying an energy source to form reactive species wherein a first portion of the process gas is activated outside of the process chamber and introduced into the process chamber and a second portion of the process gas is activated within the process chamber; contacting the residues with the reactive species to form at least one volatile product; and removing the at least one volatile product from the process chamber.

In yet another aspect, there is provided a process for removing carbon-containing residues from a surface of a process chamber wherein the process chamber is used to deposit a composite organosilicate film comprising: providing the process chamber wherein the chamber comprises a surface at least partially coated with carbon-containing residues; providing a process gas comprising an oxygen source, a fluorine source, and optionally an additive gas wherein the molar ratio of oxygen to fluorine contained within the process gas ranges from about 1 to about 10; activating the process gas by applying an energy source to form reactive species wherein a first portion of the process gas is activated outside of the process chamber and introduced into the process chamber and a second portion of the process gas is activated within the process chamber; contacting the residues with the reactive species to form at least one volatile product wherein the contacting step is conducted at a pressure of 5 torr or less; and removing the at least one volatile product from the process chamber.

BRIEF DESCRIPTION OF SEVERAL VIEWS OF THE DRAWINGS

FIG. 1 provides is a plot of effluent species concentrations recorded by the Fourier Transform Infrared (FTIR) spectrometer during the course of an $NF_3$/Ar remote (no oxygen) plasma clean conducted at a pressure of 2.5 torr.

FIG. 2a is a plot of effluent species concentrations recorded by the quadrupole mass spectrometer (QMS) during the course of an $NF_3/O_2$/Ar remote plasma clean conducted at a pressure of 2.5 torr with a ratio of $O_2/NF_3=4.0$.

FIG. 2b is a plot of effluent species concentrations recorded by the Fourier Transform Infrared (FTIR) spectrometer during the course of an $NF_3/O_2$/Ar remote plasma clean conducted at a pressure of 2.5 torr with a ratio of $O_2/NF_3=4.0$.

FIG. 3a is a plot of effluent species concentrations recorded by the quadrupole mass spectrometer (OMS) during the course of an $NF_3$/Ar (no oxygen) remote plasma clean with RF (in situ) power assist conducted at a pressure of 2.5 torr.

FIG. 3b is a plot of effluent species concentrations recorded by the Fourier Transform Infrared (FTIR) spectrometer during the course of an $NF_3/Ar$ (no oxygen) remote plasma clean with RF (in situ) power assist conducted at a pressure of 2.5 torr.

FIG. 4a is a plot of effluent species concentrations recorded by the quadrupole mass spectrometer (QMS) during the course of an $NF_3/O_2/He$ in situ plasma clean conducted at a pressure of 2.0 torr with a ratio of $O_2/NF_3=3.0$.

FIG. 4b is a plot of effluent species concentrations recorded by the Fourier Transform Infrared (FTIR) spectrometer during the course of an $NF_3/O_2/He$ in situ plasma clean conducted at a pressure of 2.0 torr with a ratio of $O_2/NF_3=3.0$.

FIG. 5a shows $CO_2$ effluent volume as a function of $O_2/NF_3$ ratio and chamber pressure at a helium flow rate of 750 sccm.

FIG. 5b shows $CO_2$ effluent volume as a function of $O_2/NF_3$ ratio and helium flow rate at a chamber pressure of 2.5 torr.

FIG. 5c shows $SiF_4$ effluent volume as a function of $O_2/NF_3$ ratio and chamber pressure at a helium flow rate of 750 sccm.

FIG. 5d shows $SiF_4$ effluent volume as a function of $O_2/NF_3$ ratio and helium flow rate at a chamber pressure of 2.5 torr.

FIG. 5e is a plot of effluent species concentrations recorded by the quadrupole mass spectrometer (QMS) during the course of an $NF_3/O_2/He$ in situ plasma clean conducted at a pressure of 2.0 torr with a ratio of $O_2/NF_3=4.0$.

FIG. 5f is a plot of effluent species concentrations recorded by the Fourier Transform Infrared (FTIR) spectrometer during the course of an $NF_3/O_2/He$ in situ plasma clean conducted at a pressure of 2.0 torr with a ratio of $O_2/NF_3=4.0$.

FIG. 5g shows $CO_2$ effluent volume as a function of $O_2/NF_3$ ratio and chamber pressure at an argon flow rate of 750 sccm.

FIG. 5h shows $CO_2$ effluent volume as a function of $O_2/NF_3$ ratio and argon flow rate at a chamber pressure of 2.5 torr.

FIG. 5i shows $SiF_4$ effluent volume as a function of $O_2/NF_3$ ratio and chamber pressure at an argon flow rate of 750 sccm.

FIG. 5j shows $SiF_4$ effluent volume as a function of $O_2/NF_3$ ratio and argon flow rate at a chamber pressure of 2.5 torr.

FIG. 5k is a plot of effluent species concentrations recorded by the quadrupole mass spectrometer (QMS) during the course of an $NF_3/O_2/Ar$ in situ plasma clean conducted at a pressure of 2.0 torr with a ratio of $O_2/NF_3=4.0$.

FIG. 5l is a plot of effluent species concentrations recorded by the Fourier Transform Infrared (FTIR) spectrometer during the course of an $NF_3/O_2/Ar$ in situ plasma clean conducted at a pressure of 2.0 torr with a ratio of $O_2/NF_3=4.0$.

FIG. 6a is a plot of effluent species concentrations recorded by the quadrupole mass spectrometer (QMS) during the course of an $NF_3/O_2/Ar$ remote plasma clean with in situ RF assist conducted at a pressure of 2.0 torr with a ratio of $O_2/NF_3=4.0$.

FIG. 6b is a plot of effluent species concentrations recorded by the Fourier Transform Infrared (FTIR) spectrometer during the course of an $NF_3/O_2/Ar$ remote plasma clean with in situ RF assist conducted at a pressure of 2.0 torr with a ratio of $O_2/NF_3=4.0$.

DETAILED DESCRIPTION OF THE INVENTION

The process disclosed herein is useful for removing carbon-containing residues from at least a portion of the surface of a substrate. In one particular embodiment, the process removes a non-volatile substance, such as carbon-containing residues, from at least a portion of a surface within the process chamber and any fixtures contained therein while minimizing damage thereto. The material to be removed from the surface being cleaned is converted from a solid non-volatile material into species having a higher volatility that allows it to be readily removed by the vacuum pump within the process chamber or other means. Unlike mechanical, wet-etching, and/or other cleaning processes, the process disclosed herein does not necessarily require the removal of the process chamber from the process line and/or the exposure of the chamber and its fixtures to liquid chemical solutions.

In one particular embodiment, the process disclosed herein is useful for cleaning carbon-containing residues from at least a portion of a surface within a process chamber that are used, for example, in the chemical vapor deposition (CVD), atomic layer deposition (ALD), spray pyrolysis, and/or vacuum deposition of composite organosilicate films onto at least one surface of a substrate such as a silicon wafer. The carbon-containing residues may be removed from one or more surfaces within the process chamber and any fixtures contained therein by contacting it with reactive species under conditions sufficient to react with the substance and form volatile products. The term "volatile products", as used herein, relates to reaction products and by-products of the reaction between the carbon-containing residues and reactive species formed by activating a process gas comprising an oxygen source and a fluorine source.

The reactive species are formed through the activation of a process gas containing an oxygen source and a fluorine source by at least one energy source. The molar ratio of oxygen and fluorine in the process gas is relatively higher than comparative cleaning chemistries employed heretofore. It has been unexpectedly found that the molar ratio of oxygen to fluorine within the process may significantly affect removal of carbon-containing residues. In some embodiments, for example, it has been unexpectedly found that a molar ratio of oxygen to fluorine greater than unity within the process may significantly enhance removal of carbon-containing residues while minimizing damage to substrates exposed thereto.

The carbon-containing deposits are removed by exposure to an activated process gas. The process gas comprises an oxygen source, a fluorine source, and optionally at least one additive gas. In these embodiments, the molar ratio of oxygen to fluorine contained within the process gas may range from 1 to 10, or from 2 to 8, or from 3 to 6. Exemplary oxygen sources include, but are limited to, oxygen ($O_2$), ozone ($O_3$), carbon monoxide (CO), carbon dioxide ($CO_2$), nitrogen dioxide ($NO_2$), nitrous oxide ($N_2O$), nitric oxide (NO), water ($H_2O$), and mixtures thereof. The amount of oxygen source present in the process gas may range from 20% to 90% based upon the total volume of process gas.

The process gas comprises a fluorine source. Examples of fluorine sources gases suitable for the process described herein include: HF (hydrofluoric acid), $F_2$ (fluorine), $NF_3$ (nitrogen trifluoride), $SF_6$ (sulfur hexafluoride), FNO (nitrosyl fluoride), $C_3F_3N_3$ (cyanuric fluoride), $C_2F_2O_2$ (oxalyl fluoride), perfluorocarbons such as $CF_4$, $C_2F_6$, $C_3F_8$, $C_4F_8$ etc., hydrofluorocarbons such as $CHF_3$ and $C_3F_7H$ etc., oxyfluorocarbons such as $C_4F_8O$ (perfluorotetrahydrofuran) etc., oxygenated hydrofluorocarbons such as hydrofluoroethers (e.g. methyltrifluoromethyl ether ($CH_3OCF_3$)), hypofluorites such as $CF_3$—OF (fluoroxytrifluoromethane (FTM)) and FO—$CF_2$—OF (bis-difluoroxy-difluoromethane (BDM)), etc., fluoroperoxides such as $CF_3$—O—O—$CF_3$ (bis-trifluoro-methyl-peroxide (BTMP)), F—O—O—F etc., fluorotrioxides such as $CF_3$—O—O—O—$CF_3$ etc., fluoroamines such a $CF_5N$ (perfluoromethylamine), fluoronitriles such as $C_2F_3N$ (perfluoroacetonitrile), $C_3F_6N$ (perfluoroproprionitrile), and $CF_3NO$ (trifluoronitrosylmethane), and $COF_2$ (carbonyl fluoride). The fluorine source can be delivered by a variety of means, such as, but not limited to, conventional cylinders, safe delivery systems, vacuum delivery systems, and/or solid or liquid-based generators that create the fluorine source at the point of use. The amount of fluorine source present within the process gas can range from 10% to 35% by volume based upon the total volume of process gas.

In certain embodiments, at least one of the oxygen source and the fluorine source are the same compound. In this connection, the molar ratio of the oxygen source to fluorine source within the process gas may be met by using one or more fluorine sources that also contain oxygen in a relatively high amount. In this connection, these fluorine source compounds can act as dual function agents within the process gas mixture and be used, for example, in addition to—or in lieu— of a separate oxygen source compound. Examples of suitable fluorine sources that also contain relatively high oxygen content and can be used within these embodiments include hypofluorites $CF_3$—OF (fluoroxytrifluoromethane (FTM)) and FO—$CF_2$—OF (bis-difluoroxy-difluoromethane (BDM)), etc., fluoroperoxides such as $CF_3$—O—O—$CF_3$ (bis-trifluoro-methyl-peroxide (BTMP)), F—O—O—F etc., fluorotrioxides such as $CF_3$—O—O—O—$CF_3$ etc.

In certain embodiments, one or more additive gases may be added to the process gas. Examples of additive gases include hydrogen, nitrogen, helium, neon, argon, krypton, xenon, and mixtures thereof. In certain embodiments, the additive gas is hydrogen. It is believed that the additive gas can modify the plasma characteristics and cleaning processes to better suit some specific applications. The additive gas may also aid in transporting the oxygen source and/or fluorine source to the substrate or process chamber. In these embodiments, the amount of additive gas present within the process gas may range from 0% to 80% by volume based upon the total volume of process gas.

The process disclosed herein is useful for cleaning carbon-containing residues from the inside of process chambers and the surfaces of various fixtures contained therein such as, but not limited to, fluid inlets and outlets, showerheads, work piece platforms, and the like while minimizing damage thereto. Exemplary process chambers include CVD and/or ALD process chambers that are used to deposit low-k dielectric materials on the surface of a substrate. The surface of the chamber and fixtures contained therein may be comprised of a variety of different materials including metals, such as titanium, aluminum, stainless steel, nickel, or alloys comprising same, and/or insulating materials, such as a ceramic, e.g., quartz or $Al_2O_3$.

The process gas may be activated by one or more energy sources such as, but not limited to, in situ plasma, remote plasma, remote thermal/catalytic activation, in-situ thermal heating, electron attachment, and photo activation, to form reactive species. These sources may be used alone or in combination such as in tandem.

Thermal or plasma activation and/or enhancement can significantly impact the efficacy of the etching and cleaning of carbon-containing residues. In thermal heating activation, the process chamber and fixtures contained therein are heated either by resistive heaters or by intense lamps. The process gas is thermally decomposed into reactive radicals and atoms that subsequently volatize the carbon-containing residues. Elevated temperature may also provide the energy source to overcome reaction activation energy barrier and enhance the reaction rates. For thermal activation, the substrate can be heated to at least 100° C., or at least 300° C., or at least 500° C. The pressure may range from 10 mTorr to 760 Torr, or from 1 Torr to 760 Torr.

In embodiments wherein an in situ activation, such as in situ RF plasma, is used to activate the process gas, oxygen and fluorine gas molecules contained within the process gas may be broken down by the discharge to form reactive species such as reactive ions and radicals. The fluorine-containing ions and radicals and oxygen-containing ions and radicals can react with the carbon-containing residues to form volatile species that can be removed from the process chamber by vacuum pumps.

In embodiments that use in situ plasma activation, the in situ plasma can be generated with a 13.56 MHz RF power supply and/or with RF power density of at least 1 $W/cm^2$, or at least 5 $W/cm^2$, or at least 10 $W/cm^2$. Alternatively, the in situ plasma can be operated at RF frequencies lower than 13.56 MHz to enhance the cleaning of grounded chamber walls and/or fixtures contained therein. The operating pressure may range from 2.5 mTorr to 100 Torr, or from 5 mTorr to 50 Torr, or from 10 mTorr to 20 Torr. In one particular embodiment, the process is conducted at a pressure of 5 torr or less. In these embodiments, an in situ energy source, such as in situ RF plasma, can be combined with a thermal and/or remote energy source. This particular embodiment ensures plasma stability and negligible damage to the process chamber and fixtures contained therein.

A remote energy source, such as, but not limited to, a remote plasma source activated by RF, microwave, or ICP activation, a remote thermal activation source, a remote catalytically activated source, or a remote source which combines thermal and catalytic activation, can be used to generate the volatile product. In remote plasma cleaning, the process gas is activated to form reactive species outside of the deposition chamber which are introduced into the process chamber to volatize the carbon-containing residues. In remote thermal activation, the process gas first flows through a heated area outside of the process chamber. The gas dissociates by contact with the high temperatures within a vessel outside of the chamber to be cleaned. Alternative approaches include the use of a remote catalytic converter to dissociate the process gas, or a combination of thermal heating and catalytic cracking to facilitate activation of the oxygen and fluorine sources within the process gas.

In certain embodiments, reactions between remote plasma generated reactive species and the carbon-containing residues can be activated/enhanced by heating the reactor. The reaction, between the remote plasma generated reactive species and carbon-containing residues, can be activated and/or enhanced by heating the reactor to a temperature sufficient to dissociate the oxygen and fluorine containing sources contained within the process gas. The specific temperature required to activate the cleaning reaction with the substance to be removed depends on the process gas recipe.

In one particular embodiment, a combination of a remote plasma and in situ plasma are employed as the energy source to activate the process gas to form the reactive species. In this embodiment, a first portion of the process gas is activated in an area outside of the process chamber, which is introduced into the process chamber after activation. A second portion of the process gas is activated within the process chamber along with any portion of the first activated gas in which the reactive species may have recombined.

In alternative embodiments, the molecules of the oxygen and fluorine sources within the process gas can be dissociated by intense exposure to photons to form reactive species. For example, ultraviolet, deep ultraviolet and vacuum ultraviolet radiation can assist breaking strong chemical bonds in carbon-containing residues as well as dissociating the oxygen and fluorine sources within the process gas thereby increasing the removal rates of carbon-containing residues. Other means of activation and enhancement to the cleaning processes described herein can also be employed. For example, one can use photon induced chemical reactions to generate reactive species and enhance the etching/cleaning reactions.

In certain embodiments, the process chamber can remain at substantially similar operating conditions (pressure and temperature) during the cleaning operation as during the deposition operation. For example, in embodiments wherein the process chamber is used for CVD, the flow of deposition gas is stopped and purged from the reactor and delivery lines. If needed, the temperature of the reactor temperature may be changed to an optimum value; however, in preferred embodiments, the process chamber temperature is maintained at the deposition process conditions. A process gas is flowed into the process chamber and activated to provide reactive species. The reactive species converts the carbon-containing residues into a volatile product that is removed from the chamber. After a prescribed time, or after the concentration of the formed volatile products detected in the chamber effluent is below an acceptable level, the flow of process gas is stopped and preferably purged from the chamber and delivery lines. The flow of the deposition gas is then restarted and the CVD deposition process resumed.

In a further embodiment, the process described herein may be used in several areas of semiconductor manufacturing other than chamber cleaning, such as etching carbon-containing materials from a substrate. In these embodiments, suitable substrates that may be used include, but are not limited to, semiconductor materials such as gallium arsenide ("GaAs"), boronitride ("BN") silicon, and compositions containing silicon such as crystalline silicon, polysilicon, amorphous silicon, epitaxial silicon, silicon dioxide ("$SiO_2$"), silicon carbide ("SiC"), silicon oxycarbide ("SiOC"), silicon nitride ("SiN"), silicon carbonitride ("SiCN"), organosilicate glasses ("OSG"), organofluorosilicate glasses ("OFSG"), fluorosilicate glasses ("FSG"), and other appropriate substrates or mixtures thereof. Substrates may further comprise a variety of layers to which the film is applied thereto such as, for example, antireflective coatings, photoresists, organic polymers, porous organic and inorganic materials, metals such as copper and aluminum, and/or diffusion barrier layers such as binary and/or transition metal ternary compounds. Traditionally wet stripping and/or plasma etching are used in these semiconductor manufacturing processes.

The process will be illustrated in more detail with reference to the following Examples, but it should be understood that the method described herein is not deemed to be limited thereto.

EXAMPLES

The following are experimental examples for removing carbon-containing residues from a process chamber using comparative processes and the process described herein. In all of the following experiments, the surface of the CVD chamber was coated with carbon-containing residues generated by depositing composite organosilicate films on silicon wafers. A mixture of 80% by weight of the pore-forming precursor limonene (LIMO) and 20% by weight of the structure-forming precursor diethoxymethylsilane (DEMS) was used to deposit the films in a PECVD process chamber. The film thickness of each film was measured and found to be approximately 1000 nm (1 micron). Table 1a provides the composition of the process gas and the process parameters used for each example.

The examples were processed using an Applied Materials P-5000 PECVD reactor or process chamber having a remote plasma source (an MKS Astron-Ex, available from MKS Instruments of Wilmington, Mass.) attached thereto. The process chamber contained a base pedestal or bottom electrode, a top electrode connected to RF power, a gas inlet for the flow of process gases, and an outlet that is connected to a vacuum pump. The walls of the chamber were grounded and maintained at a temperature of 75° C. and the chamber internals such as the susceptor were maintained at a temperature of 300° C. After depositing a composite organosilicate film, the silicon wafer was removed from the PECVD chamber and the chamber cleaned of the carbon-containing residues.

For the examples using an in situ plasma-cleaning recipe, the chamber was stabilized at a chamber pressure of 1.5 to 3.0 torr, the process gas was introduced into the chamber at gas flow rates necessary to ensure the ratio of oxygen containing gas to fluorine-containing gas shown in Table 1a. The top electrode was then powered by a 13.56 MHz RF-power source. The process gas was fed into the chamber through gas inlet, and volatile products of the reaction and the reactive gas were removed from the chamber using the vacuum pump.

Remote plasma cleaning experiments were conducted using the Applied Materials P-5000 DxZ PECVD chamber that was retrofitted with an Astron-Ex remote plasma source from MKS Corporation. After depositing a composite organosilicate film, the silicon wafer was removed from the PECVD chamber and the chamber cleaned of carbon-containing residues. This process was repeated. After evacuating the reactor, a process gas is introduced into the Astron-EX remote plasma generator. The chamber pressure is then stabilized and the remote source is turned on with 6 kW of RF power. It is believed that the intense plasma breaks down molecules of the process gas, which flow downstream through a connecting metal tube and then through the showerhead into the chamber and react with the carbon-containing residues on the chamber surfaces. The volatile compounds formed by the reactions between the reactive species and residues are removed from the reactor through the vacuum port.

Combined remote and in situ plasma (Remote+RF Assist) cleaning experiments were conducted using the Applied Materials P-5000 DxZ PECVD chamber that was retrofitted with an Astron-ex remote plasma source from MKS Corporation. A composite organosilicate film was deposited and then the silicon wafer removed from the PECVD chamber. After evacuating the reactor, a process gas was introduced into the Astron-EX remote plasma generator. The chamber pressure is then stabilized and the remote source is turned on with 6 kW of RF power. It is believed that intense plasma breaks down molecules of the process gas, which flow downstream through the showerhead into the chamber. The top electrode was then powered by a 13.56 MHz RF power source. Reactive species from the activated combined remote and in situ plasmas react with the composite organosilicate film on the wafer. The volatile compounds formed by the reactions between the reactive species and carbon-containing residues are removed from the reactor through the vacuum port.

The process chamber was cleaned for approximately 240-420 seconds after each deposition using the various processing recipes and parameters provided in Table I. Visual observations of the chamber and fixtures contained therein were taken after a series (approximately 15-20) of deposition (1000 nm each) and clean cycles (approximately 200-420 seconds each). The results of the visual observation are provided in Table II and detailed results are discussed below.

Emissions measurements were made downstream of the process pump by extractive FTIR spectroscopy (MKS Multigas, Model 2010) using a HgCdTe detector and a heated

TABLE I

Recipe Parameters

| Example # | FIG. #'s | Fluorine Containing Gas | Oxygen Containing Gas | Additive Gas | Molar Ratio of $O_2/NF_3$ | Pressure (torr) | Remote Source | In situ Source | In situ Power (W) |
|---|---|---|---|---|---|---|---|---|---|
| Comp. Ex. 1 | 1 | $NF_3$ | None | Argon | None | 2.5 | Yes | No | None |
| Comp. Ex. 2 | 2a, 2b | $NF_3$ | $O_2$ | Argon | 4.0 | 2.5 | Yes | No | None |
| Comp. Ex. 3 | 3a-3b | $NF_3$ | None | Argon | None | 2.5 | Yes | Yes | 1000.0 |
| Comp. Ex. 4 | 4a, 4b | $NF_3$ | $O_2$ | Helium | 3.0 | 2.0 | No | Yes | 1750.0 |
| Ex. 1a | 5a-5d | $NF_3$ | $O_2$ | Helium | 2.0 to 4.0 | 2.0 to 3.0 | No | Yes | 1750.0 |
| Ex. 1b | 5e, 5f | $NF_3$ | $O_2$ | Helium | 4.0 | 2.0 | No | Yes | 1750.0 |
| Ex. 2a | 5g-5j | $NF_3$ | $O_2$ | Argon | 3.0 to 6.0 | 2.0 | No | Yes | 1750.0 |
| Ex. 2b | 5k, 5l | $NF_3$ | $O_2$ | Argon | 4.0 | 2.0 | No | Yes | 1750.0 |
| Ex. 3a | None | $NF_3$ | $O_2$ | Argon | 2.0 to 4.0 | 1.5 to 2.5 | Yes | Yes | 750.0 to 1750.0 |
| Ex. 3b | 6a, 6b | $NF_3$ | $O_2$ | Argon | 3.0 to 5.0 | 2.0 | Yes | Yes | 1250.0 |

TABLE II

Recipe Performance: Visual Observations and Results

| Ex. # | Showerhead Clean? | Chamber Walls Clean? | Throttle Valve Port Clean? | Showerhead Damage? |
|---|---|---|---|---|
| Comp. Ex. 1 | Not Clean | Not Clean | Not Clean | Not Clean |
| Comp. Ex. 2 | Not clean. Thick brown residue present | Not clean; residue present | Not clean; perimeter coated with brown residue | No damage |
| Comp. Ex. 3 | Not clean. Yellow, powdery coat present on showerhead. | Not clean; brown residue present | Not clean; perimeter coated with brown residue | No damage |
| Comp. Ex. 4 | Clean | Not clean; brown, blistered, hardened residue with brown streaks and droplets present | Not clean. Crusted thick brown residue present | Some arcing; burn marks |
| Ex. 1a | Clean with minimal residue outside ceramic ring | Brown spotty residue; crusted in some areas | Brown crusted residue around throttle valve port | No damage |
| Ex. 1b. | Clean with minimal residue outside ceramic ring | Yellow streaky residue with some brown spots | Some brown spots around throttle valve port | No damage |
| Ex. 2a | Clean except for outside rim that has brown/yellow spotty residue | Brown streaky liquid residue | Not clean. Thin brown residue around rim | Minor (pinhole) burn marks |
| Ex. 2b | Clean | Clean | Clean | No damage |
| Ex. 3a | Clean | Negligible brown pinpoint residue | Minimal spotty brown/yellow residue on rim | No damage |
| Ex. 3b | Clean | Clean | Clean | No damage |

The example chamber clean processes were monitored by Fourier transform infrared spectroscopy (FTIR) at the pump exhaust and quadrupole mass spectrometry (QMS) at the CVD chamber. This process analyses was used to identify byproducts of the chamber clean, measure process emissions, and determine clean times.

0.01 m gas cell. The process was sampled through a ¼ inch compression fitting at the exhaust of the process pump. The gases of interest are consequently diluted by the $N_2$ pump purge (50 to 70 slm). Process effluents were extracted from the pump exhaust using a metal diaphragm pump. Sample lines were ⅛-inch stainless steel tubing heat traced to approximately 100° C. Sample gas was pumped through the FTIR cell before being returned to a ventilated exhaust. The temperature and pressure of the gas cell was controlled at 150° C. and 1.0 atmosphere, respectively. Reported concentrations are corrected for temperature and pressure during the measurement. Absorbance spectra were collected at 0.5 cm$^{-1}$ resolution, averaged over 8 scans. The analytical method used for concentration measurements is summarized in Table III.

TABLE III

Analytical method used for FTIR measurements

| Compound | Absorbance Regions (cm$^{-1}$) | Reference Concentration (ppm.min) |
|---|---|---|
| $NF_3$ | 870-930 | 5, 9, 16, 33, 63, 100 |
| $SiF_4$ | 1000-1044 | 140 |
| $CF_4$ | 1245-1290 | 6, 28, 53, 112, 280, 1120 |
| $COF_2$ | 1880-1980; 771-777; 934-990; 1200-1280 | 50, 80, 125, 200, 300, 500, 800, 1250, 2000, 3000, 5000 |
| HF | 3982-4364, 3405-3982 | 1, 5, 10, 15, 20, 25, 50, 75, 100, 250, 500, 750, 1000 |

The CVD chamber was monitored using a Balzers quadrupole mass spectrometer (OMS). The OMS features a 200 amu mass filter and a closed ion source. A 40-micron orifice provides high sensitivity for 1-10 torr sampling. The QMS sampled the CVD chamber using flexible ¼ inch stainless steel tubing, and was located about 24 inches from the process chamber. The mass locations (m/e) were calibrated using $N_2$ (14, 28, and 42 amu) and $NF_3$ (71 and 52 amu). No attempt was made to calibrate the QMS for quantitative measurements. The QMS inlet was differentially pumped for fast sampling, i.e. the QMS response time must be shorter than changes in the gas composition. Sample gas is extracted from a vacuum port on the CVD chamber using a turbomolecular pump. The fragments used for the partial pressure monitoring are: $NF_3$ (52 amu), $SiF_4$ (85 amu), $F_2$ (38 amu), $COF_2$ (66 amu) $CO_2$ (44 amu), $CF_4$ (69 amu). The effluent results are shown in Table IV. This table quantifies the byproduct ($SiF_4$, $CO_2$, $COF_2$, $CF_4$, and HF) volume present in the effluent stream for each recipe and the results of the analysis for some of the examples is provided in Table IV.

centimeters per minute (sccm); argon flow rate of 1400 sccm; and pressure ranging from 2.0 to 2.5 torr. Other processing parameters and conditions are provided in Table I. All cleans used a remote plasma source (i.e., Astron power on) without any plasma maintained inside the CVD chamber (i.e., no applied RF power or no in situ source). After introducing argon and stabilizing the chamber pressure, a remote plasma is initiated by applying power to the Astron plasma source. Once the argon plasma stabilized, $NF_3$ was introduced while maintaining plasma power. The chamber was cleaned for 250 seconds using the remote $NF_3$/Ar plasma.

The FTIR profiles during an exemplary chamber clean process are shown in FIG. 1. Byproducts of the chamber clean are $SiF_4$, $CO_2$, $CF_4$, $F_2$, and HF and are provided in Table IV. These measurements suggest that the silicon component of the CVD residue is removed as $SiF_4$, whereas, the carbon component is volatized mainly as $CF_4$ and partially as $CO_2$. The carbon residue also comprises considerable hydrogen content and this reacts with the fluorine to generate HF. Even though oxygen is not included as a component within the process gas, oxygen is a component of the CVD residue and is an etch byproduct. It is believed that oxygen reacts with the carbon component of the CVD residue and the fluorine plasma to produce the $CO_2$ byproduct. Fluorine ($F_2$) is generated through the recombination of F atoms produced by the remote $NF_3$ plasma.

Referring to FIG. 1, after introducing $NF_3$ there was a sharp increase in the $SiF_4$, $CF_4$, and HF concentrations. The concentrations of the $CF_4$, HF and $SiF_4$ byproducts peaked after approximately 15-30 seconds. After exposing the chamber to the activated process gas for approximately 250 seconds, the $CF_4$, $CO_2$, and $SiF_4$ byproduct concentrations, as measured by FTIR returned to baseline levels. This profile typically indicates that etching is complete and that the chamber walls are clear of CVD residues. The HF concentration also reaches a relatively steady value of approximately 800 ppm. The $SiF_4$, $CF_4$, and HF profiles all indicate that the clean is complete after approximately 200 seconds and further exposure to the remote $NF_3$ plasma is ineffective.

TABLE IV

Effluent Results for Different Recipes

| Ex. # | Molar Ratio of $O_2/NF_3$ | Pressure (torr) | Remote Source | In situ Source | In situ Power (W) | Avg. $SiF_4$ (scc) | Avg. $CO_2$ (scc) | Avg. HF (scc) | Avg. $CF_4$ (scc) | Avg. $COF_2$ (scc) |
|---|---|---|---|---|---|---|---|---|---|---|
| Comp. Ex. 1 | None | 2.5 | Yes | No | None | 7.29 | 12.28 | 310.51 | 6.17 | 1.94 |
| Comp. Ex. 2 | 4.0 | 2.5 | Yes | No | None | 9.0 | 46.8 | 344.81 | 0.3 | 48.0 |
| Comp. Ex. 3 | None | 2.5 | Yes | Yes | 1000.0 | 25.40 | None | 1111.34 | 413.00 | 28.86 |
| Comp. Ex. 4 | 3.0 | 2.0 | No | Yes | 1750.0 | 20.75 | 181.43 | 890.42 | 2.45 | 73.17 |
| Ex. 1b | 4.0 | 2.0 | No | Yes | 1750.0 | 20.66 | 198.03 | 916.74 | 1.20 | 57.83 |
| Ex. 2b | 4.0 | 2.0 | No | Yes | 1750.0 | 33.26 | 287.48 | 1234.29 | 1.60 | 113.62 |
| Ex. 3b | 3.0-5.0 | 2.0 | Yes | Yes | 1250.0 | 31.60 | 380.74 | 1164.54 | 8.06 | 175.01 |

Comparative Example 1

$NF_3$/Ar Remote Plasma Clean

The process conditions used to evaluate remote $NF_3$/Ar plasmas for cleaning CVD chambers of carbon containing residues are as follows: $NF_3$ flow rate of 700 standard cubic Referring to Table IV, total hydrocarbon residue removal as measured by the volume of $CO_2$ and HF in the effluent stream is approximately 3% and 25%, respectively, of the amount removed using the process gas recipe and parameters of Example 3b. Silicon residue removal as measured by the volume of $SiF_4$ in the effluent stream is approximately 22% of the amount removed using the process gas recipe and parameters of Example 3b. Carbon removal as measured by the moles of carbon removed as $CF_4$, $COF_2$ and $CO_2$ is approximately 4% of the amount removed using the process gas and parameters of Example 3b.

Comparative example 1 demonstrates that remote $NF_3/Ar$ plasmas are ineffective at cleaning CVD chambers of polymeric residues containing carbon, silicon, fluorine, and hydrogen.

Comparative Ex. 2

$NF_3/O_2/Ar$ Remote Plasma Clean

The process conditions used to evaluate remote $NF_3/O_2/Ar$ plasmas for cleaning CVD chambers of carbon containing residues are summarized in Table V. Ten depositions and thirteen clean sequences were completed. The range of process parameters used was as follows: $NF_3$ flow rate (0 to 300 sccm), $O_2$:$NF_3$ ratio (0.0 to 4.0), pressure (2.5 to 3.0 torr). All cleans used a remote plasma source (i.e., Astron power on) without any plasma maintained inside the CVD chamber (i.e., no applied RF power) as summarized in Table I. After introducing argon and stabilizing the chamber pressure, a remote plasma was initiated by applying power to the Astron plasma source. Once the argon plasma stabilized, a process gas mixture containing $NF_3$ and $O_2$ was introduced while maintaining plasma power. The chamber was then cleaned for 130-250 seconds using the remote $NF_3/O_2/Ar$ plasma.

TABLE V

Process Conditions for Comparative Example 2
(Remote $NF_3/O_2/Ar$ Plasma) Clean Tests

| Run | Clean Time (s) | Ar (sccm) | Pressure (torr) | $NF_3$ (sccm) | $O_2$ (sccm) | $O_2/NF_3$ Ratio | RF (W) | Astron Power | Plasma Stability |
|---|---|---|---|---|---|---|---|---|---|
| 1 | 250.0 | 500 | 2.5 | 300.0 | 1200.0 | 4.0 | None | On | Stable |
| 2 | 250.0 | 500 | 2.5 | 300.0 | 1200.0 | 4.0 | None | On | Stable |
| 3 | 250.0 | 500 | 2.5 | 300.0 | 1200.0 | 4.0 | None | On | Stable |
| 4 | 250.0 | 500 | 2.5 | 300.0 | 1200.0 | 4.0 | None | On | Stable |
| 5 | 250.0 | 500 | 2.5 | 300.0 | 1200.0 | 4.0 | None | On | Stable |
| 6 | No Clean | No Clean | No Clean | No Clean | No Clean | No Clean | None | On | No Clean |
| 7 | 250.0 | 500 | 2.5 | 300.0 | 1200.0 | 4.0 | None | On | Stable |
| 8 | 250.0 | 500 | 2.5 | 300.0 | 1200.0 | 4.0 | None | On | Stable |
| 9 | 250.0 | 500 | 2.5 | 300.0 | 1200.0 | 4.0 | None | On | Stable |
| 10 | 250.0 | 500 | 2.5 | 0.0 | 1200.0 | No $NF_3$ | None | On | Stable |
| 11 | 0.0 | 500 | 2.5 | 300.0 | 1200.0 | 4.0 | None | On | Fault |
| 12 | 130.0 | 1400 | 3.0 | 700.0 | 0.0 | 0.0 | None | On | Stable |
| 13 | 250.0 | 500 | 2.5 | 300.0 | 1200.0 | 4.0 | None | On | Stable |

The QMS and FTIR profiles during an exemplary chamber clean process (Run #5) are shown in FIGS. 2a and 2b, respectively. Byproducts of the chamber clean are $SiF_4$, $CO_2$, $COF_2$, $F_2$, and HF. These measurements suggest that the silicon component of the CVD residue is removed as $SiF_4$, whereas, the carbon component is volatized as $CO_2$ and $COF_2$. The carbon residue also comprises considerable hydrogen content and this reacts with the fluorine to generate HF. Most of the silicon and carbon is volatized as $SiF_4$, $CO_2$, and HF.

Referring to FIGS. 2a and 2b, after introducing the process gas containing $NF_3$ and $O_2$, there was a sharp increase in the $SiF_4$, $CO_2$, and HF concentrations. The concentration of these byproducts peaked after approximately 30 seconds and then diminished. After running the clean for approximately 120 seconds, there was a small change in the byproduct concentrations measured by QMS (FIG. 2a) or FTIR (FIG. 2b). Accompanying this decay of the etch byproducts is a sharp increase in the $F_2$ partial pressure measured by QMS (FIG. 2a). The appearance of $F_2$ is typically a good end-point monitor. Fluorine atoms generated in the $NF_3/O_2$ plasma are consumed by etching during the chamber clean. Once the etch process is complete, however, fluorine atoms are available to recombine as $F_2$. The $SiF_4$, $CO_2$, HF, and $F_2$ profiles all indicate that the clean is complete and further exposure to the $NF_3/O_2$ plasma is ineffective. Indeed, a considerable over etch occurred for each of the 13 chamber cleans of Comparative Ex. 2.

After completing the deposition/clean cycles provided in Table V, the interior of the CVD chamber was visually inspected. Despite a relatively small number of depositions and PDEMS chemical usage (31 grams), considerable amounts of carbon residues were visible on the surfaces of the CVD chamber. The results of this visual inspection are summarized in Table II. A thick brown residue was present on the showerhead and around the perimeter of the throttle valve port. The chamber walls were also coated with a thin residue layer. The showerhead was not damaged.

Referring to Table IV, total hydrocarbon residue removal as measured by the volume of $CO_2$ and HF in the effluent stream is approximately 13% and 30%, respectively, of the amount removed using the processing parameters of Example 3b. Silicon residue removal as measured by the volume of $SiF_4$ in the effluent stream is approximately 28% of the amount removed using the processing parameters of Example 3b. Carbon removal as measured by the moles of carbon removed as $CF_4$, $COF_2$ and $CO_2$ is approximately 17% of the amount removed using the processing parameters of Example 3b.

Comparative Example 2 demonstrates that remote $NF_3/O_2/Ar$ plasmas are ineffective at cleaning CVD chambers of polymeric residues containing carbon, silicon, fluorine, and hydrogen.

Comparative Ex. 3

$NF_3/Ar$ Remote Plasma Clean with In Situ RF Assist

The process conditions used to evaluate the combined remote and in situ $NF_3/Ar$ plasmas for cleaning CVD chambers of carbon containing residues are summarized in Table VI. Ten depositions and twelve clean sequences were completed (Table VI). The range of process parameters for each run was as follows: $NF_3$ flow rate (700 sccm), $O_2:NF_3$ ratio (0.0), pressure (2.5 torr), RF power (1000 W). No oxygen ($O_2$) was included as a process gas during the chamber cleans. All cleans utilized a remote plasma source (i.e., Astron power on) combined with an in situ plasma source maintained inside the CVD chamber (i.e., 1000 W applied RF power). After introducing argon and stabilizing the chamber pressure, a remote plasma was initiated by applying power to the Astron plasma source. Once the argon plasma stabilized, $NF_3$ was then introduced while maintaining the remote plasma power. Once the remote $NF_3/Ar$ plasma stabilized (15 seconds), RF power was applied to the showerhead electrode, initiating a plasma inside the CVD chamber (i.e., in situ plasma). The chamber was then cleaned for 210-360 seconds using the combined remote and in situ $NF_3/Ar$ plasma.

TABLE VI

Process Conditions for Remote $NF_3/Ar$ Plasmas with In situ RF Assist

| Run | Clean Time (seconds) | Ar Flow (sccm) | Pressure (torr) | $NF_3$ Flow (sccm) | Astron Power | Plasma Stability | RF Power (W) |
|---|---|---|---|---|---|---|---|
| 1 | 250.0 | 1400 | 2.5 | 700.0 | On | Stable | No RF |
| 2 | 250.0 | 1400 | 2.5 | 700.0 | On | Stable | 1000.0 |
| 3 | 250.0 | 1400 | 2.5 | 700.0 | On | Stable | 1000.0 |
| 4 | 210.0 | 1400 | 2.5 | 700.0 | On | Stable | 1000.0 |
| 5 | 360.0 | 1400 | 2.5 | 700.0 | On | Stable | 1000.0 |
| 6 | 330.0 | 1400 | 2.5 | 700.0 | On | Stable | 1000.0 |
| 7 | 300.0 | 1400 | 2.5 | 700.0 | On | Stable | 1000.0 |
| 8 | 300.0 | 1400 | 2.5 | 700.0 | On | Stable | 1000.0 |
| 9 | 300.0 | 1400 | 2.5 | 700.0 | On | Stable | 1000.0 |
| 10 | 300.0 | 1400 | 2.5 | 700.0 | On | Stable | 1000.0 |
| 11 | 300.0 | 1400 | 2.5 | 700.0 | On | Stable | 1000.0 |
| 12 | 300.0 | 1400 | 2.5 | 700.0 | On | Stable | 1000.0 |

The QMS and FTIR profiles during an exemplary chamber clean process are shown in FIGS. 3a and 3b, respectively. Byproducts of the chamber clean are $SiF_4$, $CF_4$, $F_2$, and HF. These measurements suggest that the silicon component of the CVD residue is removed as $SiF_4$, whereas, the carbon component is primarily volatized as $CF_4$. The carbon residue also comprises considerable hydrogen content and this reacts with the fluorine to generate HF. Most of the silicon and carbon is volatized as $SiF_4$, $CF_4$, and HF. Some $COF_2$ and $CO_2$ are also measured (FIG. 3b). Even though no $O_2$ is included as a process gas, oxygen is a component of the CVD residue and is an etch byproduct. Presumably this oxygen reacts with the carbon component of the CVD residue and the fluorine plasma to produce the $CO_2$ and $COF_2$ byproducts. Much $F_2$ is generated through the recombination of F atoms produced by the remote $NF_3$ plasma. The concentration of $CF_4$ is much higher in Comparative Ex. 3 than in Comparative Ex. 2 thus indicating that carbon is primarily removed as $CF_4$ and not as $CO_2$ or $COF_2$ because only a limited amount of oxygen is present in the cleaning gas mixture.

After introducing $NF_3$, there was a sharp increase in the $SiF_4$, $CF_4$, and HF concentrations (FIGS. 3a and 3b). The concentrations of the HF and $SiF_4$ byproducts peaked after approximately 30 seconds whereas the peak in the $CF_4$ concentration occurred after approximately 120 seconds. After running the clean for approximately 200 seconds, the byproduct concentrations, as measured by OMS (FIG. 3a) or FTIR (FIG. 3b) returned to baseline levels. This profile typically indicates that etching is complete and that the chamber walls are clear of CVD residues. The $SiF_4$, $CF_4$, and HF profiles all indicate that the clean was complete after approximately 200 seconds and further exposure to the combined $NF_3$ plasma is ineffective. Indeed, a considerable over etch time was included for each of the 12 chamber cleans of Comparative Ex. 3.

Referring to Table IV, total hydrocarbon residue removal as measured by the volume of HF in the effluent stream was approximately 95% of the amount removed using the process parameters of Example 3b. Silicon residue removal as measured by the volume of $SiF_4$ in the effluent stream was approximately 80% of the amount removed using the processing parameters of Example 3b. Carbon removal as measured by the moles of carbon removed as $CF_4$, $COF_2$ and $CO_2$ is approximately 77% of the amount removed using the processing parameters of Example 3b.

After completing the deposition and clean cycles of Table VI, the interior of the CVD chamber was visually inspected. Despite a relatively small number of depositions and PDEMS chemical usage (44 g), considerable amounts of carbon residues were visible on the surfaces of the CVD chamber. The results of this visual inspection are summarized in Table II. A yellow powdery residue was coated onto the showerhead and the chamber walls and the showerhead perimeter were coated with a brown residue. The throttle valve port was coated with a thick brown residue. There was no evidence of plasma damage to the showerhead. These observations are consistent with the effluent profiles that indicate that significant carbon-based residue remains after cleaning the chamber for times ranging from 210 to 360 seconds.

Comparative Ex. 3 demonstrates that remote $NF_3/Ar$ plasmas with in situ RF power assist are not completely effective at cleaning CVD chambers of polymeric residues containing carbon, silicon, fluorine, and hydrogen. While they remove a majority of the $SiF_4$ residue they do not adequately remove the carbon-based polymer residue.

Comparative Ex. 4

$NF_3/O_2/He$ In Situ Plasma with $O_2/NF_3$ Ratio=3.0

The process conditions used to evaluate in situ $NF_3/O_2/He$ plasmas with an $O_2/NF_3$ ratio equal to 3.0 for cleaning CVD chambers of carbon containing residues are summarized in Table I. Sixteen deposition and clean sequences were completed and the parameters for these runs are provided in Table VII. Effluent profiles for #15 are shown in FIGS. 4a and 4b and cleaning results are discussed in Table II. The effluent profiles indicate that the primary effluent species are $COF_2$, $CO_2$, $F_2$, $SiF_4$ and HF. Other species such as $CF_4$ and COF are also detected in the effluent stream. The first two effluent products ($COF_2$ and $CO_2$) are primarily formed when dissociated oxygen and fluorine atoms combine with hydrocarbon-based deposition residue, while HF is formed primarily by the interaction of hydrogen from the hydrocarbon with fluorine. The unreacted fluorine atoms recombine to form fluorine gas, which is liberated from the chamber along with $SiF_4$ formed when the fluorine atoms react with the silicon residue in the chamber.

TABLE VII

Process Conditions for In situ $NF_3/O_2/He$ Plasma Cleans with $O_2/NF_3$ Ratio = 3

| Run | Clean Time (seconds) | Pressure (torr) | $NF_3$ Flow (sccm) | $O_2$ Flow (sccm) | He Flow (sccm) | RF Power (W) | Plasma Stability |
|---|---|---|---|---|---|---|---|
| 1 | 240.0 | 2.0 | 300.0 | 900.0 | 2000.0 | 1750 | Unstable |
| 2 | 240.0 | 2.0 | 300.0 | 900.0 | 2000.0 | 1750 | Unstable |

TABLE VII-continued

Process Conditions for In situ $NF_3/O_2/He$
Plasma Cleans with $O_2/NF_3$ Ratio = 3

| Run | Clean Time (seconds) | Pressure (torr) | $NF_3$ Flow (sccm) | $O_2$ Flow (sccm) | He Flow (sccm) | RF Power (W) | Plasma Stability |
|---|---|---|---|---|---|---|---|
| 3 | 240.0 | 2.0 | 300.0 | 900.0 | 2000.0 | 1750 | Unstable |
| 4 | 260.0 | 2.0 | 300.0 | 900.0 | 2000.0 | 1750 | Unstable |
| 5 | 260.0 | 2.0 | 300.0 | 900.0 | 1000.0 | 1750 | Unstable |
| 6 | 225.0 | 2.0 | 300.0 | 900.0 | 1000.0 | 1750 | Stable |
| 7 | 220.0 | 2.0 | 300.0 | 900.0 | 1000.0 | 1750 | Stable |
| 8 | 210.0 | 2.0 | 300.0 | 900.0 | 1000.0 | 1750 | Stable |
| 9 | 220.0 | 2.0 | 300.0 | 900.0 | 1000.0 | 1750 | Stable |
| 10 | 220.0 | 2.0 | 300.0 | 900.0 | 1000.0 | 1750 | Stable |
| 11 | 220.0 | 2.0 | 300.0 | 900.0 | 1000.0 | 1750 | Stable |
| 12 | 220.0 | 2.0 | 300.0 | 900.0 | 1000.0 | 1750 | Stable |
| 13 | 220.0 | 2.0 | 300.0 | 900.0 | 1000.0 | 1750 | Stable |
| 14 | 220.0 | 2.0 | 300.0 | 900.0 | 1000.0 | 1750 | Stable |
| 15 | 220.0 | 2.0 | 300.0 | 900.0 | 1000.0 | 1750 | Stable |
| 16 | 220.0 | 2.0 | 300.0 | 900.0 | 1000.0 | 1750 | Stable |

After introducing $NF_3$, there was a sharp increase in the $SiF_4$, $CO_2$, and HF concentrations (FIGS. 4a and 4b). The concentrations of the $SiF_4$ and $CO_2$ byproducts peaked after approximately 30 to 45 seconds whereas the peak in the HF concentration occurred after approximately 90 to 120 seconds. Peak $SiF_4$, $CO_2$ and HF concentrations were 200 parts per million (ppm), 1000 ppm and 4700 ppm, respectively. After running the clean for 210-260 seconds the $SiF_4$ concentrations, as measured by QMS (FIG. 4a) or FTIR (FIG. 4), returned to baseline levels. The $CO_2$ and HF byproduct concentrations—while not at baseline levels—also exhibited a downward trend. This decay of the etch byproducts was accompanied by a sharp increase in the $F_2$ partial pressure measured by QMS (FIG. 4a). The $F_2$ peak appeared at approximately 150 to 180 seconds after the start of the clean, and its appearance was typically a good end-point monitor. Fluorine atoms generated in the $NF_3/O_2$ plasma were consumed by etching during the chamber clean. Once the etch process was complete, however, fluorine atoms are available to recombine as $F_2$. The $SiF_4$, $CO_2$, HF, and $F_2$ profiles all indicated that exposure to the $NF_3/O_2/He$ plasma beyond 240 seconds is ineffective in removing any residue remaining on the chamber walls.

Referring to Table IV, total hydrocarbon residue removal as measured by the volume of $CO_2$ and HF in the effluent stream is approximately 48% and 76%, respectively, of the amount removed using the processing parameters of Example 3b. Silicon residue removal as measured by the volume of $SiF_4$ in the effluent stream is approximately 65% of the amount removed using the processing parameters of Example 3b. Carbon removal as measured by the moles of carbon removed as $CF_4$, $COF_2$ and $CO_2$ is approximately 46% of the amount removed using the processing parameters of Example 3b.

Visual observations of the chamber and the showerhead conducted after this series of tests in Table II indicated that the in situ cleaning recipe used for these tests successfully removed all residue from the showerhead, while causing some minor showerhead damage. However, this recipe could not clean the chamber walls and brown blistered and hardened residue remained even after repeated cleaning. Brown liquid streaks and droplets were also observed along some sections of the chamber wall. A thick brown, crusted residue was found around the throttle valve port. These observations are consistent with the calculated total hydrocarbon removal calculated from the effluent profiles.

Comparative Ex. 4 demonstrated that in situ $NF_3/O_2/He$ plasmas at $O_2$ to $NF_3$ ratios of 3 cannot completely clean CVD chambers of polymeric residues containing carbon, silicon, fluorine, and hydrogen. Significant carbon-based residue remains after multiple cleans with clean times ranging from 210 to 260 seconds.

Example 1a $NF_3/O_2/He$ In Situ Plasma Clean Design of Experiment Studies

The process conditions for a series of deposition and cleaning cycles conducted using $NF_3/O_2/He$ in situ plasmas are shown in Table VIII. Twenty depositions and twenty-two clean sequences were completed. The amount (volume) of $CO_2$ in the effluent stream as a function of pressure, $NF_3$ flow rate and $O_2/NF_3$ ratio is shown in FIGS. 5a and 5b. Cleaning performance results are summarized in Table II. The contour plots shown in FIGS. 5a and 5b indicate that the amount of $CO_2$ in the effluent stream increases when the $O_2/NF_3$ ratio is increased from 2.0 to 4.0, when pressure is reduced from 3.0 torr to 2.0 torr, and when additive gas (helium) flow rate is increased from 500 to 2000 sccm. The contour plots shown in FIGS. 5c and 5d indicate that the amount of $SiF_4$ in the effluent stream also increases, but only by a small amount, when the $O_2/NF_3$ ratio is increased from 2.0 to 4.0 and when pressure is reduced from 3.0 torr to 2.0 torr. The volume of $SiF_4$ in the effluent stream does not change when helium flow rate increases, thus indicating that silicon residue removal is essentially complete and independent of additive gas flow rate.

TABLE VIII

Test Conditions for $NF_3/O_2/He$
In situ Plasma Clean Design of Experiment Studies

| Run | He Flow (sccm) | $O_2/NF_3$ Ratio | $NF_3$ Flow (sccm) | $O_2$ Flow (sccm) | Pressure (torr) | Clean Time (sec) | RF Power (W) | Plasma Stability |
|---|---|---|---|---|---|---|---|---|
| 1 | 1000 | 4.0 | 300.0 | 1200 | 2.0 | 200.0 | 1750 | Stable |
| 2 | 1000 | 4.0 | 300.0 | 1200 | 2.0 | 200.0 | 1750 | Stable |
| 3 | 1000 | 4.0 | 300.0 | 1200 | 2.0 | 200.0 | 1750 | Stable |
| 4 | 750 | 3.0 | 300.0 | 900 | 2.0 | 200.0 | 1750 | Stable |
| 5 | 500 | 2.0 | 300.0 | 600 | 2.0 | 200.0 | 1750 | Stable |
| 6 | 500 | 3.0 | 300.0 | 900 | 2.5 | 200.0 | 1750 | Stable |
| 7 | 500 | 2.0 | 300.0 | 600 | 3.0 | 200.0 | 1750 | Unstable |
| 8 | 1000 | 4.0 | 300.0 | 1200 | 2.0 | 200.0 | 1750 | Stable |
| 9 | 1000 | 3.0 | 300.0 | 900 | 2.5 | 200.0 | 1750 | Stable |

TABLE VIII-continued

Test Conditions for $NF_3/O_2/He$
In situ Plasma Clean Design of Experiment Studies

| Run | He Flow (sccm) | $O_2/NF_3$ Ratio | $NF_3$ Flow (sccm) | $O_2$ Flow (sccm) | Pressure (torr) | Clean Time (sec) | RF Power (W) | Plasma Stability |
|---|---|---|---|---|---|---|---|---|
| 10 | 500 | 4.0 | 300.0 | 1200 | 2.0 | 200.0 | 1750 | Stable |
| 11 | 1000 | 4.0 | 300.0 | 1200 | 3.0 | 200.0 | 1750 | Stable |
| 12 | 750 | 2.0 | 300.0 | 600 | 2.5 | 200.0 | 1750 | Stable |
| 13 | 750 | 3.0 | 300.0 | 900 | 2.5 | 200.0 | 1750 | Stable |
| 14 | 750 | 4.0 | 300.0 | 1200 | 2.5 | 200.0 | 1750 | Stable |
| 15 | 500 | 4.0 | 300.0 | 1200 | 3.0 | 200.0 | 1750 | Stable |
| 16 | 750 | 3.0 | 300.0 | 900 | 3.0 | 200.0 | 1750 | Stable |
| 17 | 1000 | 2.0 | 300.0 | 600 | 2.0 | 200.0 | 1750 | Stable |
| 18 | 750 | 3.0 | 300.0 | 900 | 2.5 | 200.0 | 1750 | Stable |
| 19 | 750 | 3.0 | 300.0 | 900 | 2.5 | 200.0 | 1750 | Stable |
| 20 | 1000 | 2.0 | 300.0 | 600 | 3.0 | 200.0 | 1750 | Stable |
| 21 | 750 | 3.0 | 300.0 | 900 | 2.5 | 200.0 | 1750 | Stable |
| 22 | 750 | 4.0 | 300.0 | 1200 | 2.0 | 200.0 | 1750 | Stable |

Referring to Table II, visual observations of the chamber and the showerhead conducted after this series of experiments indicated that the showerhead was clean except for the presence of minimal residue outside the outer lip of the showerhead ceramic ring. There was no showerhead damage. Brown spotty residue, some of it crusted, was present on the chamber walls. A brown, crusted residue was also present around the throttle valve port.

Example 1b $NF_3/O_2/He$ In Situ Plasma Clean at $O_2/NF_3$ Ratio=4.0 and P=2.0 Torr The process conditions used to evaluate in situ $NF_3/O_2/He$ plasmas for cleaning CVD chambers of carbon containing residues are summarized in Table IX. Twenty-one deposition and clean sequences were completed. Effluent profiles for Run #15 (P=2.0 torr and $O_2/NF_3$ ratio=4.0) are provided in FIGS. 5e and 5f and cleaning results are discussed in Table II. The effluent profiles indicate that the primary effluent species are $COF_2$, $CO_2$, $F_2$, $SiF_4$ and HF. The first two effluent products ($COF_2$ and $CO_2$) are primarily formed when dissociated oxygen and fluorine atoms combine with hydrocarbon-based deposition residue, while HF is formed primarily by the interaction of hydrogen from the hydrocarbon with fluorine. Other species such as $CF_4$ and COF are also detected in the effluent stream. The unreacted fluorine atoms recombine to form fluorine gas, which is liberated from the chamber along with $SiF_4$ formed when the fluorine atoms react with the silicon residue in the chamber.

TABLE IX

Test Conditions for $NF_3/O_2/He$ In situ Plasma Clean
at $O_2/NF_3$ Ratio = 4.0 and P = 2.0 torr

| Run | He Flow (sccm) | $O_2/NF_3$ Ratio | Pressure (torr) | $NF_3$ Flow (sccm) | $O_2$ Flow (sccm) | Plasma Stability | RF Power (W) | Clean Time (seconds) |
|---|---|---|---|---|---|---|---|---|
| 1 | 1500 | 3.0 | 2.0 | 300.0 | 900.0 | Unstable | 1750 | Variable |
| 2 | 1500 | 3.0 | 2.0 | 300.0 | 900.0 | Unstable | 1750 | Variable |
| 3 | 1500 | 3.0 | 2.0 | 300.0 | 900.0 | Unstable | 1750 | 220.0 |
| 4 | 1500 | 5.0 | 2.0 | 300.0 | 1500.0 | Unstable | 1750 | 220.0 |
| 5 | 1000 | 5.0 | 2.0 | 300.0 | 1500.0 | Unstable | 1750 | 220.0 |
| 6 | 1000 | 4.0 | 2.0 | 300.0 | 1200.0 | Unstable | 1750 | 220.0 |
| 7 | 1000 | 4.0 | 2.0 | 300.0 | 1200.0 | Stable | 1750 | 240.0 |
| 8 | 1000 | 4.0 | 2.0 | 300.0 | 1200.0 | Stable | 1750 | 225.0 |
| 9 | 1000 | 4.0 | 2.0 | 300.0 | 1200.0 | Stable | 1750 | 200.0 |
| 10 | 1000 | 4.0 | 2.0 | 300.0 | 1200.0 | Stable | 1750 | 200.0 |
| 11 | 1000 | 4.0 | 2.0 | 300.0 | 1200.0 | Stable | 1750 | 200.0 |
| 12 | 1000 | 4.0 | 2.0 | 300.0 | 1200.0 | Stable | 1750 | 200.0 |
| 13 | 1000 | 4.0 | 2.0 | 300.0 | 1200.0 | Stable | 1750 | 200.0 |
| 14 | 1000 | 4.0 | 2.0 | 300.0 | 1200.0 | Stable | 1750 | 200.0 |
| 15 | 1000 | 4.0 | 2.0 | 300.0 | 1200.0 | Stable | 1750 | 200.0 |
| 16 | 1000 | 4.0 | 2.0 | 300.0 | 1200.0 | Stable | 1750 | 200.0 |
| 17 | 1000 | 4.0 | 2.0 | 300.0 | 1200.0 | Stable | 1750 | 200.0 |
| 18 | 1000 | 4.0 | 2.0 | 300.0 | 1200.0 | Stable | 1750 | 200.0 |
| 19 | 1000 | 4.0 | 2.0 | 300.0 | 1200.0 | Stable | 1750 | 200.0 |
| 20 | 1000 | 4.0 | 2.0 | 300.0 | 1200.0 | Stable | 1750 | 180.0 |
| 21 | 1000 | 4.0 | 2.0 | 300.0 | 1200.0 | Stable | 1750 | 180.0 |

After introducing $NF_3$, there was a sharp increase in the $SiF_4$, $CO_2$, and HF concentrations (FIGS. 5e and 5f). The concentrations of the $SiF_4$ and $CO_2$ byproducts peaked after approximately 30 to 45 seconds whereas the peak in the HF concentration occurred after approximately 90 to 120 seconds. Peak $SiF_4$, $CO_2$ and HF concentrations were 200 ppm, 1000 ppm and 4700 ppm, respectively. After running the clean for 210-260 seconds the $SiF_4$ concentrations, as measured by QMS (FIG. 5e) or FTIR (FIG. 5f), returned to baseline levels. The $CO_2$ and HF byproduct concentrations although not at baseline levels also had a downward trend. Accompanying this decay of the etch byproducts was a sharp increase in the $F_2$ partial pressure measured by QMS (FIG. 5e). The $F_2$ peak appeared at approximately 150 to 180 seconds after the start of the clean, and its appearance was typically a good end-point monitor. Fluorine atoms generated in the $NF_3/O_2$ plasma were consumed by etching during the chamber clean. Once the etch process was complete, however, fluorine atoms are available to recombine as $F_2$. The $SiF_4$, $CO_2$, HF, and $F_2$ profiles all indicated that exposure to the $NF_3/O_2$/He plasma beyond 240 seconds is ineffective in removing hydrocarbon residue remaining on the chamber walls.

Referring to Table IV, total hydrocarbon residue removal as measured by the volume of $CO_2$ and HF in the effluent stream is approximately 52% and 79%, respectively, of the amount removed using the processing parameters of Example 3b. Silicon residue removal as measured by the volume of $SiF_4$ in the effluent stream is approximately 65% of the amount removed using the processing parameters of Example 3b. Carbon removal as measured by the moles of carbon removed as $CF_4$, $COF_2$ and $CO_2$ is approximately 46% of the amount removed using the processing parameters of Example 3b.

completely clean the chamber walls and yellow, streaky residue with some brown spots remained even after repeated cleaning. Some brown spots were also observed around the throttle valve port. These observations are consistent with the calculated total hydrocarbon removal calculated from the effluent profiles.

Example 1b demonstrates that a clean time of approximately 240 seconds coupled with a high $O_2/NF_3$ ratio (ratio=4.0 in this case) and low pressures (below 3.0 torr in this case) ensured removal of a substantial part of the silicon-containing residue, and more than half of the hydrocarbon-based residue.

Example 2a $NF_3/O_2$/Ar In Situ Plasma Clean

The process conditions for a series of runs using $NF_3/O_2$/Ar in situ plasmas are shown in Table X. Nineteen depositions and twenty clean sequences were completed. The amount (volume) of $CO_2$ in the effluent stream as a function of pressure, $NF_3$ flow rate and $O_2/NF_3$ ratio is shown in FIGS. 5g and 5h. Cleaning performance results are summarized in Table II. The contour plots shown in FIGS. 5g and 5h indicate that the amount of $CO_2$ in the effluent stream increased when the $O_2/NF_3$ ratio was increased from 3.0 to 5.0, but does not change appreciably when pressure is reduced from 2.0 torr to 1.5 torr. However, decreasing the additive gas (argon) flow rate from 1000 sccm to 500 sccm increased $CO_2$ removal marginally. The contour plots shown in FIGS. 5i and 5j indicate that the amount of $SiF_4$ in the effluent stream increased by approximately 15% when the $O_2/NF_3$ ratio was increased from 3.0 to 5.0, but did not change when pressure was reduced from 2.0 torr to 1.5 torr.

TABLE X

Test Conditions for $NF_3/O_2$/Ar In situ Plasma Clean

| Run | Clean Time (seconds) | Ar Flow (sccm) | $O_2/NF_3$ Ratio | Pressure (torr) | $NF_3$ Flow (sccm) | $O_2$ Flow (sccm) | Plasma Stability | RF Power (W) |
|---|---|---|---|---|---|---|---|---|
| 1 | 240.0 | 1000 | 4.0 | 2.0 | 300.0 | 1200.0 | Stable | 1750 |
| 2 | 120.0 | 1000 | 4.0 | 2.0 | 300.0 | 1200.0 | Stable | 1750 |
| 3 | 200.0 | 500 | 3.0 | 2.0 | 300.0 | 900.0 | Stable | 1750 |
| 4 | 200.0 | 500 | 5.0 | 2.0 | 300.0 | 1500.0 | Stable | 1750 |
| 5 | 200.0 | 1000 | 5.0 | 2.0 | 300.0 | 1500.0 | Stable | 1750 |
| 6 | 200.0 | 1000 | 3.0 | 2.0 | 300.0 | 900.0 | Stable | 1750 |
| 7 | 200.0 | 1000 | 3.0 | 1.5 (1.64) | 300.0 | 900.0 | Unstable | 1750 |
| 8 | 200.0 | 500 | 3.0 | 1.5 | 300.0 | 900.0 | Unstable | 1750 |
| 9 | 200.0 | 500 | 5.0 | 2.0 | 200.0 | 1000.0 | Unstable | 1750 |
| 10 | 200.0 | 1000 | 5.0 | 2.0 | 200.0 | 1000.0 | Unstable | 1750 |
| 11 | 200.0 | 1000 | 4.0 | 2.0 | 250.0 | 1000.0 | Stable | 1750 |
| 12 | 220.0 | 1000 | 5.0 | 2.0 | 250.0 | 1250.0 | Stable | 1750 |
| 13 | 220.0 | 750 | 5.0 | 2.0 | 250.0 | 1250.0 | Stable | 1750 |
| 14 | 220.0 | 500 | 5.0 | 2.0 | 250.0 | 1250.0 | Stable | 1750 |
| 15 | 200.0 | 500 | 6.0 | 2.0 | 250.0 | 1500.0 | Stable | 1750 |
| 16 | 200.0 | 500 | 5.0 | 2.0 | 300.0 | 1500.0 | Stable | 1750 |
| 17 | 200.0 | 500 | 5.0 | 2.0 | 300.0 | 1500.0 | Stable | 1750 |
| 18 | 200.0 | Tool Fault | Tool Fault | Tool Fault | Tool Fault | Tool Fault | Tool Fault | Tool Fault |
| 19 | 200.0 | 500 | 5.0 | 2.0 | 300.0 | 1500.0 | Stable | 1750 |
| 20 | 200.0 | 500 | 5.0 | 2.0 | 300.0 | 1500.0 | Stable | 1750 |

Referring to Table II, visual observations of the chamber and the showerhead conducted after this series of tests indicated that the in situ cleaning recipe used for these tests successfully removed the residue from the showerhead without any showerhead damage. However, this recipe could not Referring to Table II, visual observations of the chamber and the showerhead conducted after this series of experiments indicated that the showerhead was clean except for the presence of a brownish-yellow, spotty residue on the outside rim. The showerhead had minor (pinhole) burn marks, which were probably caused by unstable plasmas at low pressures. There was a streaky liquid-like brown residue present on the chamber walls and a thin brown residue was present around the rim of the throttle valve port. The residue resulted from the wide range of process conditions used in this study; i.e. some of the test conditions were not as proficient in cleaning residues as that in Example 3b.

Example 2b $NF_3/O_2/Ar$ In Situ Plasma Clean at $O_2/NF_3$ Ratio=4.0 and P=2.0 Torr The experimental test conditions for this example are shown in Table XI below. Effluent profiles for Run #20 (P=2.0 torr and $O_2/NF_3$ ratio=4.0) are shown in FIGS. 5$k$ and 5$l$ and cleaning results are discussed in Table II. The effluent profiles indicate that the primary effluent species are $COF_2$, $CO_2$, $F_2$, $SiF_4$ and HF. The first two effluent products ($COF_2$ and $CO_2$) were primarily formed when dissociated oxygen and fluorine atoms combined with hydrocarbon-based deposition residue, while HF was formed primarily by the interaction of hydrogen from the hydrocarbon with fluorine. Other species such as $CF_4$ and $COF_2$ were also detected in the effluent stream. The unreacted fluorine atoms recombined to form fluorine gas, which was liberated from the chamber along with $SiF_4$ formed when the fluorine atoms reacted with the silicon residue in the chamber.

The decay of the etch byproducts was accompanied by a sharp increase in the $F_2$ partial pressure measured by QMS (FIG. 5$k$). The $F_2$ peak appeared at approximately 180 to 240 seconds after the start of the clean, and its appearance was typically a good end-point monitor. Fluorine atoms generated in the $NF_3/O_2$ plasma were consumed by etching during the chamber clean. Once the etch process was complete, however, fluorine atoms were available to recombine as $F_2$. The $F_2$ concentration profile leveled out after four minutes thus providing a substantial over-etch time of approximately 3 to 4 minutes.

Referring to Table II, visual observations of the chamber and the showerhead conducted after this series of tests indicated that the showerhead, chamber walls, and the throttle valve port were clean. There was an isolated burn mark on the showerhead although the showerhead itself did not show any structural damage.

Referring to Table IV, total hydrocarbon residue removal as measured by the volume of $CO_2$ and HF in the effluent stream is approximately 76% and 100%, respectively, of the amount removed using the processing parameters of Example 3b. Silicon residue removal as measured by the volume of $SiF_4$ in the effluent stream is approximately 100% of the amount removed using the processing parameters of Example 3b.

TABLE XI

Test Conditions for $NF_3/O_2/Ar$ In situ Plasma Clean at $O_2/NF_3$ Ratio = 4.0 and P = 2.0 torr

| Run | Clean Time (seconds) | Ar Flow (sccm) | Pressure (torr) | $NF_3$ Flow (sccm) | $O_2$ Flow (sccm) | $O_2/NF_3$ Ratio | Plasma Stability | RF Power (W) |
|---|---|---|---|---|---|---|---|---|
| 1 | 360.0 | 500 | 2.0 | 400.0 | 1600.0 | 4.0 | Stable | 1750.0 |
| 2 | 360.0 | 500 | 2.0 | 400.0 | 1600.0 | 4.0 | Stable | 1750.0 |
| 3 | 360.0 | 500 | 2.0 | 300.0 | 1800.0 | 6.0 | Stable | 1750.0 |
| 4 | 360.0 | 500 | 2.0 | 400.0 | 1600.0 | 4.0 | Stable | 1750.0 |
| 5 | 360.0 | 500 | 2.0 | 400.0 | 1600.0 | 4.0 | Stable | 1750.0 |
| 6 | 360.0 | 500 | 2.0 | 400.0 | 1600.0 | 4.0 | Stable | 1750.0 |
| 7 | 360.0 | 500 | 2.0 | 400.0 | 1600.0 | 4.0 | Stable | 1750.0 |
| 8 | 360.0 | 500 | 2.0 | 400.0 | 1600.0 | 4.0 | Stable | 1750.0 |
| 9 | 360.0 | 500 | 2.0 | 400.0 | 1600.0 | 4.0 | Stable | 1750.0 |
| 10 | 360.0 | 500 | 2.0 | 400.0 | 1600.0 | 4.0 | Stable | 1750.0 |
| 11 | 360.0 | 500 | 2.0 | 400.0 | 1600.0 | 4.0 | Stable | 1750.0 |
| 12 | 360.0 | 500 | 2.0 | 400.0 | 1600.0 | 4.0 | Stable | 1750.0 |
| 13 | 360.0 | 500 | 2.0 | 400.0 | 1600.0 | 4.0 | Stable | 1750.0 |
| 14 | 360.0 | 500 | 2.0 | 400.0 | 1600.0 | 4.0 | Stable | 1750.0 |
| 15 | 360.0 | 500 | 2.0 | 400.0 | 1600.0 | 4.0 | Stable | 1750.0 |
| 16 | 420.0 | 500 | 2.0 | 400.0 | 1600.0 | 4.0 | Stable | 1750.0 |
| 17 | 420.0 | 500 | 2.0 | 400.0 | 1600.0 | 4.0 | Stable | 1750.0 |
| 18 | 420.0 | 500 | 2.0 | 400.0 | 1600.0 | 4.0 | Stable | 1750.0 |
| 19 | 420.0 | 500 | 2.0 | 400.0 | 1600.0 | 4.0 | Stable | 1750.0 |
| 20 | 420.0 | 500 | 2.0 | 400.0 | 1600.0 | 4.0 | Stable | 1750.0 |

After introducing $NF_3$, there was a sharp increase in the $SiF_4$, $CO_2$, and HF concentrations (FIGS. 5$k$ and 5$l$). The $SiF_4$ concentration peaked at approximately 400 ppm, approximately 90 seconds after starting the clean, whereas the peak in HF and $CO_2$ concentration occurred earlier after approximately 30 and 60 seconds, respectively. Peak $CO_2$ and HF concentrations were approximately 2500 ppm and 9000 ppm, respectively. The $SiF_4$ concentrations, as measured by OMS (FIG. 5$k$) or FTIR (FIG. 5$l$) reached baseline levels after approximately four minutes, and $CO_2$ and HF concentrations reached baseline levels after approximately six minutes.

Carbon removal as measured by the moles of carbon removed as $CF_4$, $COF_2$ and $CO_2$ is approximately 72% of the amount removed using the processing parameters of Example 3b.

These observations indicate the in situ cleaning recipe used for these tests successfully removed both silicon and hydrocarbon residue when a sufficiently long clean time (300-420 seconds) was used. The observations are consistent with the effluent profiles, which indicate that only trace amounts of HF, negligible amounts of $CO_2$ and $COF_2$, and no $SiF_4$ or $CF_4$ were present at the end of the clean (420 seconds).

Example 3a

$NF_3/O_2/Ar$ Remote Plasma Clean with In Situ RF Assist: DOE Study

The process conditions used to evaluate the combined remote and in situ $NF_3/O_2/Ar$ plasmas for cleaning CVD chambers of carbon containing residues are summarized in Table XII. A total of forty-nine deposition and fifty-two clean sequences was completed. The range of process parameters investigated was as follows: $NF_3$ flow rate (400-1600 sccm), $O_2:NF_3$ ratio (2.0-4.0), pressure (1.75-2.50 torr), RF power (750-1750 W). All cleans used a remote plasma source (i.e. Astron power on) combined with a plasma that was maintained inside the CVD chamber (i.e., 750-1750 W applied RF power).

After introducing argon and stabilizing chamber pressure, a remote plasma was initiated by applying power to the Astron plasma source. Once the argon plasma stabilized, a process gas containing $NF_3$ and $O_2$ was introduced while maintaining the remote plasma power. Once the remote $NF_3/O_2/Ar$ plasma stabilized (15 seconds), RF power was applied to the showerhead electrode, to initiate a plasma inside the CVD chamber (i.e. in situ plasma). The chamber was cleaned for 320-420 seconds using the combined remote and in situ $NF_3/Ar$ plasma. Each of the process conditions summarized in Table XII was followed by a supplementary (over-etch) clean with the following conditions: $NF_3$=400 sccm, $O_2$=1600 sccm, Ar=500 sccm, Pressure=2.0 torr, Astron Source=On, RF power=1000 W, time=60-180 s. The purpose of this over etch clean was to remove any carbon residue remaining after each of the experimental processes summarized in Table XII.

Referring to Table II, after completing the deposition/clean cycles, the interior of the CVD chamber was visually inspected. Despite the large number of depositions and PDEMS chemical usage (190 g), minimal amounts of carbon residues were visible on the surfaces of the CVD chamber. The showerhead was completely clear of any CVD residue. The chamber walls were almost completely clean, having a negligible amount of residue visible as a brown watermark. The throttle valve port had a minimal spotty brown/yellow residue around rim. There was no evidence of plasma damage to the showerhead and all plasmas were stable.

Example 3a demonstrated that combined remote and in situ $NF_3/O_2/Ar$ plasmas are effective at cleaning CVD chambers of polymeric residues containing carbon, silicon, fluorine, and hydrogen.

TABLE XII $NF_3/O_2/Ar$ Remote Plasma Clean with In situ RF Assist

| Run | Clean Time(s) | Ar (sccm) | Pressure (torr) | $NF_3$ Flow (sccm) | $O_2$ Flow (sccm) | $O_2/NF_3$ Ratio | RF (W) | Astron Power | Plasma Stability |
|---|---|---|---|---|---|---|---|---|---|
| 1 | 420 | 500 | 2.0 | 400 | 1600.0 | 4.0 | 1250.0 | On | Stable |
| 2 | 420 | 500 | 2.0 | 400. | 1600.0 | 4.0 | 1250.0 | On | Stable |
| 3 | 420 | 500 | 2.0 | 400.0 | 1600.0 | 4.0 | 1250.0 | On | Stable |
| 4 | 420 | 500 | 2.0 | 400.0 | 1600.0 | 4.0 | 1250.0 | On | Stable |
| 5 | 420 | 500 | 2.5 | 200.0 | 400.0 | 2.0 | 1750.0 | On | Stable |
| 6 | 420 | 500 | 2.5 | 200.0 | 400.0 | 2.0 | 750.0 | On | Stable |
| 8 | 420 | 500 | 1.5 | 200.0 | 800.0 | 4.0 | 1750.0 | On | Stable |
| 9 | 420 | 500 | 1.5 | 200.0 | 400.0 | 2.0 | 1750.0 | On | Stable |
| 10 | 420 | 500 | 2.0 | 300.0 | 900.0 | 3.0 | 1250.0 | On | Stable |
| 11 | 420 | 500 | 2.5 | 300.0 | 900.0 | 3.0 | 1250.0 | On | Stable |
| 12 | 420 | 500 | 2.5 | 400.0 | 800.0 | 2.0 | 750.0 | On | Stable |
| 13 | 420 | 500 | 1.5 | 200.0 | 400.0 | 2.0 | 750.0 | On | Stable |
| 14 | 420 | 500 | 2.0 | 300.0 | 900.0 | 3.0 | 750.0 | On | Stable |
| 15 | 420 | 500 | 1.5 | 200.0 | 800.0 | 4.0 | 750.0 | On | Stable |
| 16 | 420 | 500 | 2.0 | 400.0 | 1600.0 | 4.0 | 1250.0 | On | Stable |
| 17 | 420 | 500 | 2.5 | 400.0 | 800.0 | 2.0 | 1750.0 | On | Stable |
| 18 | 420 | 500 | 2.0 | 200.0 | 600.0 | 3.0 | 1250.0 | On | Stable |
| 19 | 420 | 500 | 1.5 | 400.0 | 1600.0 | 4.0 | 1750.0 | On | Stable |
| 20 | 320 | 500 | 2.0 | 400.0 | 1600.0 | 4.0 | 1750.0 | On | Stable |
| 21 | 320 | 500 | 2.0 | 400.0 | 1600.0 | 4.0 | 1250.0 | On | Stable |
| 22 | 320 | 500 | 2.0 | 400.0 | 1600.0 | 4.0 | 1250.0 | On | Stable |
| 23 | 320 | 500 | 2.0 | 300.0 | 900.0 | 3.0 | 1250.0 | On | Stable |
| 24 | 320 | 500 | 2.0 | 300.0 | 900.0 | 3.0 | 1250.0 | On | Stable |
| 25 | 320 | 500 | 1.5 | 300.0 | 900.0 | 3.0 | 1250.0 | On | Stable |
| 26 | 320 | 500 | 2.0 | 400.0 | 1200.0 | 3.0 | 1250.0 | On | Stable |
| 27 | 320 | 500 | 1.5 | 400.0 | 800.0 | 2.0 | 750.0 | On | Stable |
| 28 | 320 | 500 | 2.0 | 300.0 | 1200.0 | 4.0 | 1250.0 | On | Stable |
| 29 | 320 | 500 | 1.5 | 400.0 | 800.0 | 2.0 | 1750.0 | On | Stable |
| 30 | 320 | 500 | 1.5 | 400.0 | 1600.0 | 4.0 | 750.0 | On | Stable |
| 31 | 320 | 500 | 1.5 | 400.0 | 800.0 | 2.0 | 1750.0 | On | Stable |
| 32 | 320 | 500 | 2.5 | 400.0 | 1600.0 | 4.0 | 1750.0 | On | Stable |
| 33 | 320 | 500 | 2.0 | 300.0 | 900.0 | 3.0 | 1750.0 | On | Stable |
| 34 | 420 | 500 | 1.6 | 300 | 900 | 3.0 | 1250 | On | Stable |
| 35 | 420 | 500 | 1.6 | 300 | 900 | 3.0 | 1250 | On | Stable |
| 36 | 420 | 500 | 1.6 | 300 | 900 | 3.0 | 1250 | On | Stable |
| 37 | 420 | 500 | 1.75 | 300 | 900 | 3.0 | 1250 | On | Stable |
| 38 | 420 | 500 | 2.5 | 200 | 800 | 4.0 | 750 | On | Stable |
| 39 | 420 | 500 | 2.5 | 200 | 800 | 4.0 | 1750 | On | Stable |
| 40 | 420 | 500 | 2 | 300 | 600 | 2.0 | 1250 | On | Stable |
| 41 | 420 | 500 | 2.5 | 400 | 1600 | 4.0 | 750 | On | Stable |
| 42 | 360 | 500 | 2.5 | 200 | 800 | 4.0 | 1750 | On | Stable |
| 43 | 360 | 500 | 1.75 | 300 | 1200 | 4.0 | 1250 | On | Stable |
| 44 | 360 | 500 | 1.75 | 300 | 1200 | 4.0 | 1250 | On | Stable |

TABLE XII-continued

NF$_3$/O$_2$/Ar Remote Plasma Clean with In situ RF Assist

| Run | Clean Time(s) | Ar (sccm) | Pressure (torr) | NF$_3$ Flow (sccm) | O$_2$ Flow (sccm) | O$_2$/NF$_3$ Ratio | RF (W) | Astron Power | Plasma Stability |
|---|---|---|---|---|---|---|---|---|---|
| 45 | 360 | 500 | 1.75 | 300 | 1200 | 4.0 | 1250 | On | Stable |
| 46 | 360 | 500 | 1.75 | 300 | 1200 | 4.0 | 1250 | On | Stable |
| 47 | 360 | 500 | 1.75 | 300 | 1200 | 4.0 | 1250 | On | Stable |
| 48 | 360 | 500 | 1.75 | 300 | 1200 | 4.0 | 1250 | On | Stable |
| 49 | 360 | 500 | 1.75 | 300 | 1200 | 4.0 | 1250 | On | Stable |
| 50 | 360 | 500 | 2.00 | 400 | 1600 | 4.0 | 1250 | On | Stable |
| 51 | 360 | 500 | 2.00 | 400 | 1600 | 4.0 | 1250 | On | Stable |
| 52 | 360 | 500 | 2.00 | 400 | 1600 | 4.0 | 1250 | On | Stable |
| 53 | 360 | 500 | 2.00 | 400 | 1600 | 4.0 | 1250 | On | Stable |
| 54 | 360 | 500 | 2.00 | 400 | 1600 | 4.0 | 1250 | On | Stable |

Example 3b

NF$_3$/O$_2$/Ar Remote Plasma Clean with In Situ RF Assist

The process conditions used to demonstrate the efficacy of the remote NF$_3$/O$_2$/Ar plasmas with in situ RF assist for cleaning CVD chambers of carbon containing residues are as follows: NF$_3$ flow rate=400 sccm, O$_2$:NF$_3$ ratio=4.0, Argon flow rate=500 sccm, Pressure=2.0 torr, Astron power=On, RF power=1250 W. The preferred embodiment was evaluated by completing twenty (20) deposition/clean sequences (Table 11). All cleans utilized a remote plasma source (i.e., Astron power on) combined with an in situ plasma source that is maintained inside the CVD chamber (i.e., 1250 W applied RF power).

A remote plasma was initiated after introducing argon (500 sccm) and stabilizing the chamber pressure at 2.0 torr by applying power to the Astron plasma source. Once the argon plasma has stabilized, NF$_3$ (400 sccm) and O$_2$ (1600 sccm) are then introduced while maintaining the remote plasma power. Once the remote NF$_3$/O$_2$/Ar plasma has stabilized (15 seconds), RF power is then applied to the showerhead electrode, initiating a plasma inside the CVD chamber (i.e., in situ plasma). The chamber is then cleaned for 360 seconds using the combined remote and in situ NF$_3$/O$_2$/Ar plasma. No over-etch clean was used following the deposition and preferred chamber clean recipe.

TABLE XIII

NF$_3$/O$_2$/Ar Remote Plasma Clean with In situ RF Assist

| Run | Clean Time(s) | Ar (sccm) | Pressure (torr) | NF$_3$ Flow (sccm) | O$_2$ Flow (sccm) | O$_2$/NF$_3$ Ratio | RF (W) | Astron Power | Plasma Stability |
|---|---|---|---|---|---|---|---|---|---|
| 1 | 240.0 | 500 | 2.0 | 400.0 | 1600.0 | 4.0 | 1250.0 | On | Stable |
| 2 | 240.0 | 500 | 2.0 | 400.0 | 1600.0 | 4.0 | 1250.0 | On | Stable |
| 3 | 240.0 | 500 | 2.0 | 400.0 | 1600.0 | 4.0 | 1250.0 | On | Stable |
| 4 | 300.0 | 500 | 2.0 | 400.0 | 1600.0 | 4.0 | 1250.0 | On | Stable |
| 5 | 300.0 | 500 | 2.0 | 400.0 | 1600.0 | 4.0 | 1250.0 | On | Stable |
| 6 | 300.0 | 500 | 2.0 | 400.0 | 1600.0 | 4.0 | 1250.0 | On | Stable |
| 7 | 300.0 | 500 | 2.0 | 400.0 | 1600.0 | 4.0 | 1250.0 | On | Stable |
| 8 | 300.0 | 500 | 2.0 | 400.0 | 1600.0 | 4.0 | 1250.0 | On | Stable |
| 9 | 300.0 | 500 | 2.0 | 400.0 | 1600.0 | 4.0 | 1250.0 | On | Stable |
| 10 | 300.0 | 500 | 2.0 | 400.0 | 1600.0 | 4.0 | 1250.0 | On | Stable |
| 11 | 240.0 | 500 | 2.0 | 400.0 | 1600.0 | 4.0 | 1250.0 | On | Stable |
| 12 | 240.0 | 500 | 2.0 | 400.0 | 1600.0 | 4.0 | 1250.0 | On | Stable |
| 13 | 240.0 | 500 | 2.0 | 400.0 | 1600.0 | 4.0 | 1250.0 | On | Stable |
| 14 | 240.0 | 500 | 2.0 | 400.0 | 1600.0 | 4.0 | 1250.0 | On | Stable |
| 15 | 300.0 | 500 | 2.0 | 400.0 | 1600.0 | 4.0 | 1250.0 | On | Stable |
| 16 | 300.0 | 500 | 2.0 | 400.0 | 1600.0 | 4.0 | 1250.0 | On | Stable |
| 17 | 360.0 | 500 | 2.0 | 400.0 | 1600.0 | 4.0 | 1250.0 | On | Stable |
| 18 | 360.0 | 500 | 2.0 | 400.0 | 1600.0 | 4.0 | 1250.0 | On | Stable |
| 19 | 360.0 | 500 | 2.0 | 400.0 | 1600.0 | 4.0 | 1250.0 | On | Stable |
| 20 | 360.0 | 500 | 2.0 | 400.0 | 1600.0 | 4.0 | 1250.0 | On | Stable |
| 21 | 360.0 | 500 | 2.0 | 400.0 | 1600.0 | 4.0 | 1250.0 | On | Stable |
| 22 | 360.0 | 500 | 2.0 | 400.0 | 1600.0 | 4.0 | 1250.0 | On | Stable |

QMS and FTIR profiles during an exemplary chamber clean process (Run #20) are shown in FIGS. 6a and 6b. Byproducts of the chamber clean were SiF$_4$, CF$_4$, F$_2$, HF, COF$_2$, and CO$_2$. These measurements suggest that the silicon component of the CVD residue was removed as SiF$_4$, whereas, the carbon component was primarily volatized as CO$_2$, COF$_2$, and CF$_4$. The carbon residue also comprised considerable hydrogen content and this reacted with the fluorine to generate HF. Most of the silicon was converted to SiF$_4$, while most of the hydrocarbon residue was converted to CO$_2$, COF$_2$, CF$_4$, and HF. Much F$_2$ was generated through the recombination of F atoms produced by the remote NF$_3$ plasma.

After introducing NF$_3$ and O$_2$, there was a sharp increase in all byproduct concentrations: SiF$_4$, CF$_4$, CO$_2$, COF$_2$, and HF (FIGS. 6a and 6b). The $CF_4$ byproduct concentration peaked approximately 10 seconds after starting the clean, while the other byproduct ($CO_2$, $SiF_4$, and HF) concentrations peaked approximately 45 to 60 seconds after igniting the in situ plasma. The profiles reach their steady state values approximately 240 to 300 seconds after igniting the in situ plasma thus indicating that etching was complete and that chamber walls were clear of CVD residues. The $SiF_4$, $CF_4$, $CO_2$, $COF_2$ and HF profiles all indicated that the clean was essentially complete after 240 seconds and further exposure to the combined $NF_3/O_2/Ar$ plasma was unnecessary. Indeed, a considerable over etch was included for each of the 20 chamber cleans of Example 3b.

Referring to Table II, after completing the deposition/clean cycles, the interior of the CVD chamber was visually inspected. Despite the large number of depositions and PDEMS chemical usage, the surfaces of the CVD chamber were pristine. The showerhead, chamber walls, and throttle valve port were completely clear of any CVD residue. There was no plasma damage to the showerhead and all plasmas were stable. These observations were consistent with the total amount of hydrocarbon and silicon residue removed as measured by the volume of $CO_2$, HF and $SiF_4$ in the effluent stream. Referring to Table IV, carbon removed as measured by the moles of carbon removed as $CF_4$, $COF_2$ and $CO_2$ was maximized by the combined remote and in situ plasma recipe.

Example 3b demonstrated that combined remote and in situ $NF_3/O_2/Ar$ plasmas were effective at cleaning CVD chambers of polymeric residues containing carbon, silicon, fluorine, and hydrogen.

The invention claimed is:

1. A process for removing residue comprising silicon and carbon from at least a portion of a surface of a substrate, the process comprising:
   providing a process gas comprising an oxygen source, a fluorine source, and optionally an additive gas wherein the molar ratio of oxygen to fluorine contained within the process gas ranges from about 2 to about 8;
   activating the process gas using at least one energy source to provide reactive species; and
   contacting the surface of the substrate with the reactive species to volatilize and remove the residue from the surface.

2. The process of claim 1 wherein at least a portion of the activating step occurs in a location outside of where the contacting step is conducted.

3. The process of claim 1 wherein the activating step and contacting step occur in the same location.

4. The process of claim 1 wherein the oxygen source comprises at least one selected from oxygen, ozone, nitric oxide, nitrous oxide, nitrogen dioxide, carbon monoxide, carbon dioxide, water, and mixtures thereof.

5. The process of claim 1 wherein the activating step uses a remote plasma energy source.

6. The process of claim 5 wherein the activating step uses in situ plasma.

7. The process of claim 1 wherein the fluorine source comprises at least one selected from $F_2$; HF, $NF_3$; $SF_6$; $COF_2$; NOF; $C_3F_3N_3$; $C_2F_2O_2$; a perfluorocarbon; a hydrofluorocarbon; an oxyfluorocarbon; an oxygenated hydrofluorocarbon; a hydrofluoroether; a hypofluorite; a fluoroperoxide; a fluorotrioxide; a fluoroamine; a fluoronitrile; and mixtures thereof.

8. The process of claim 1 wherein at least one of the oxygen source and the fluorine source are the same compound.

9. The process of claim 8 wherein the same compound is at least one selected from a hypofluorite, a fluoroperoxide, a fluorotrioxide, and mixtures thereof.

10. The process of claim 1 wherein the process gas comprises an additive gas.

11. The process of claim 10 wherein the additive gas is one selected from $H_2$, $N_2$, He, Ne, Kr, Xe, Ar, and mixtures thereof.

12. A process for removing residues comprising silicon and carbon from a surface of a process chamber wherein the process chamber is used to deposit a composite organosilicate material, the process comprising:
   providing the process chamber wherein the chamber comprises a surface at least partially coated with residues;
   providing a process gas comprising an oxygen source, a fluorine source, and optionally an additive gas wherein the molar ratio of oxygen to fluorine contained within the process gas ranges from about 2 to about 8;
   activating the process gas using at least one energy source to form reactive species;
   contacting the residues with the reactive species to form at least one volatile product; and
   removing the at least one volatile product from the process chamber.

13. The process of claim 12 wherein at least a portion of the activating step is conducted in a location outside of the process chamber.

14. The process of claim 13 wherein the contacting step is conducted at a pressure of 5 torr or less.

15. A process for removing residues comprising silicon and carbon from a surface of a process chamber wherein the process chamber is used to deposit a composite organosilicate material, the process comprising:
   providing the process chamber wherein the chamber comprises a surface at least partially coated with residues;
   providing a process gas comprising an oxygen source, a fluorine source, and optionally an additive gas wherein the molar ratio of oxygen to fluorine contained within the process gas ranges from about 2 to about 8;
   activating the process gas by applying at least one energy source to form reactive species wherein at least a portion of the process gas is activated within the process chamber and at least another portion of the process gas is activated in a location outside of the process chamber;
   contacting the residues with the reactive species to form at least one volatile product; and
   removing the at least one volatile product from the process chamber.

16. A process for removing residues comprising silicon and carbon from a surface of a process chamber wherein the process chamber is used to deposit a composite organosilicate material, the process comprising:
   providing the process chamber wherein the chamber comprises a surface at least partially coated with residues;
   providing a process gas comprising an oxygen source, a fluorine source, and optionally an additive gas wherein the molar ratio of oxygen to fluorine contained within the process gas ranges from about 2 to about 8;
   activating the process gas by applying at least one energy source to form reactive species wherein a first portion of the process gas is activated outside of the process chamber and introduced into the process chamber and a second portion of the process gas is activated within the process chamber;
   contacting the residues with the reactive species to form at least one volatile product wherein the contacting step is conducted at a pressure of 5 torr or less; and removing at least one volatile product from the process chamber.

17. The process of claim 16 wherein the composite organosilicate film is produced from the deposition of a pore-forming precursor and a structure-forming precursor.

18. The process of claim 17 where the pore-forming precursor is at least one selected from alpha-terpinene, limonene, cyclohexane, 1,2,4-trimethylcyclohexane, 1,5-dimethyl-1,5-cyclooctadiene, camphene, adamantane, 1,3-butadiene, substituted dienes, decahydronaphthelene, and mixtures thereof.

19. The process of claim 17 wherein the structure forming precursor is at least one selected from diethoxymethylsilane, dimethoxymethylsilane, di-isopropoxymethylsilane, di-t-butoxymethylsilane, methyltriethoxysilane, methyltrimethoxysilane, methyltri-isopropoxysilane, methyltri-t-butoxysilane, dimethyldimethoxysilane, dimethyldiethoxysilane, dimethyldi-isopropoxysilane, dimethyldi-t-butoxysilane, 1,3,5,7-tetramethylcyclotatrasiloxane, octamethyl-cyclotetrasiloxane, and tetraethoxysilane.

20. A process for the deposition of an composite organosilicate film on a substrate, the process comprising:

placing the substrate into a process chamber;

depositing the composite organosilicate film onto the substrate and a silicon and carbon-containing residue onto at least one surface within the chamber using a pore-forming precursor and a structure-forming precursor wherein the depositing step is conducted by a process selected from chemical vapor deposition, atomic layer deposition, vacuum deposition, spray pyrolysis and combinations thereof;

providing a process gas comprising an oxygen source, a fluorine source, and optionally an additive gas wherein the molar ratio of oxygen to fluorine contained within the process gas ranges from about 2 to about 8;

activating the process gas by applying at least one energy source to form reactive species;

contacting the residues with the reactive species to form at least one volatile product; and removing from the reactor the at least one volatile product to clean the reactor.

* * * * *